(12) United States Patent
Weng et al.

(10) Patent No.: US 11,777,472 B2
(45) Date of Patent: Oct. 3, 2023

(54) BULK ACOUSTIC WAVE RESONATOR

(71) Applicant: Shenzhen Newsonic Technologies Co., Ltd., Shenzhen (CN)

(72) Inventors: Guojun Weng, Shenzhen (CN); Jian Wang, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/992,170

(22) Filed: Nov. 22, 2022

(65) Prior Publication Data
US 2023/0087523 A1    Mar. 23, 2023

(30) Foreign Application Priority Data
Jul. 8, 2022   (CN) .......................... 202210796817.9

(51) Int. Cl.
*H03H 9/02* (2006.01)
*H03H 9/17* (2006.01)
*H03H 9/05* (2006.01)
*H03H 9/13* (2006.01)

(52) U.S. Cl.
CPC ........ *H03H 9/173* (2013.01); *H03H 9/02133* (2013.01); *H03H 9/0504* (2013.01); *H03H 9/13* (2013.01)

(58) Field of Classification Search
CPC .. H03H 91/73; H03H 9/02133; H03H 9/0504; H03H 9/13; H01L 41/053; H10N 30/88
USPC .......................................................... 310/348
See application file for complete search history.

(56) References Cited

U.S. PATENT DOCUMENTS

| | | | |
|---|---|---|---|
| 2005/0142888 A1* | 6/2005 | Ebuchi | H03H 3/02 438/738 |
| 2019/0013792 A1* | 1/2019 | Lee | H03H 9/176 |

FOREIGN PATENT DOCUMENTS

CN            114553163 A        5/2022

* cited by examiner

*Primary Examiner* — Derek J Rosenau
(74) *Attorney, Agent, or Firm* — Leason Ellis LLP

(57) ABSTRACT

A bulk acoustic wave resonator is provided. The bulk acoustic wave resonator incudes a carrier substrate, having a main surface extending along a first direction; a piezoelectric layer, located on a side of the carrier substrate in a second direction perpendicular to the main surface of the carrier substrate; a first electrode and a second electrode; a cavity boundary structure, having a body part extending along the first direction and a protruding part protruding from the body part toward the piezoelectric layer; a resonant cavity, defined by the cavity boundary structure and the piezoelectric layer; and a periphery dielectric layer, located on a side of the protruding part of the cavity boundary structure away from the resonant cavity, a material of the periphery dielectric layer is different from a material of at least a portion of the protruding part adjacent to the periphery dielectric layer.

24 Claims, 30 Drawing Sheets

BULK ACOUSTIC WAVE RESONATOR

CROSS-REFERENCE TO RELATED APPLICATION

The application claims priority to the Chinese patent application No. 202210796817.9, filed Jul. 8, 2022, the entire disclosure of which is incorporated herein by reference as part of the present application.

TECHNICAL FIELD

The embodiments of the disclosure relate to a bulk acoustic wave resonator.

BACKGROUND

With the rapid development of mobile communication technology, filters based on resonators are more and more widely used in communication devices such as smartphones. In a film bulk acoustic resonator (FBAR), a lower electrode, a piezoelectric layer and an upper electrode are usually formed in sequence on a base substrate, thereby forming a resonant structure with piezoelectric property on the base substrate. In order to improve the performance of bulk acoustic wave resonator, the structure of bulk acoustic wave resonator is continuously optimized to improve the quality factor (Q value) of the resonator.

SUMMARY

At least one embodiment of the disclosure provides a bulk acoustic wave resonator, comprising: a carrier substrate, having a main surface extending along a first direction; a piezoelectric layer, located on a side of the carrier substrate in a second direction perpendicular to the main surface of the carrier substrate; a first electrode and a second electrode, disposed on opposite sides of the piezoelectric layer in the second direction; a cavity boundary structure, disposed between the carrier substrate and the piezoelectric layer in the second direction, wherein the cavity boundary structure has a body part and a protruding part, the body part extends along the first direction, and the protruding part protrudes from the body part along the second direction away from the carrier substrate and toward the piezoelectric layer; a resonant cavity, defined by the cavity boundary structure and the piezoelectric layer; and a periphery dielectric layer, located on a side of the protruding part of the cavity boundary structure away from the resonant cavity, and between the body part of the cavity boundary structure and the piezoelectric layer, a material of the periphery dielectric layer is different from a material of at least a portion of the protruding part adjacent to the periphery dielectric layer.

In the bulk acoustic wave resonator according to an embodiment of the disclosure, the protruding part of the cavity boundary structure has an inner sidewall and an outer sidewall opposite to each other, the body part comprises a first portion and a second portion, the first portion is located between the inner sidewall of the protruding part in the first direction, and the second portion is located on a side of the protruding part adjacent to the outer sidewall of the protruding part in the first direction.

In the bulk acoustic wave resonator according to an embodiment of the disclosure, the resonant cavity is surrounded by the protruding part of the cavity boundary structure and is defined by the inner sidewall of the protruding part in the first direction, and the resonant cavity is defined between the first portion of the cavity boundary structure and a portion of the piezoelectric layer in the second direction.

In the bulk acoustic wave resonator according to an embodiment of the disclosure, the periphery dielectric layer is located between the second portion of the body part of the cavity boundary structure and the piezoelectric layer in the second direction.

In the bulk acoustic wave resonator according to an embodiment of the disclosure, the periphery dielectric layer surrounds the protruding part of the cavity boundary structure in the first direction, and the protruding part separates the periphery dielectric layer apart from the resonant cavity.

In the bulk acoustic wave resonator according to an embodiment of the disclosure, the cavity boundary structure comprises a boundary layer and a dielectric support layer, the boundary layer is disposed on a side of the piezoelectric layer and the periphery dielectric layer close to the carrier substrate, and the dielectric support layer is disposed on a side of the boundary layer close to the carrier substrate, and between the boundary layer and the carrier substrate, a material of the periphery dielectric layer is different from a material of the boundary layer.

In the bulk acoustic wave resonator according to an embodiment of the disclosure, the resonant cavity is defined by the piezoelectric layer and the boundary layer of the cavity boundary structure.

In the bulk acoustic wave resonator according to an embodiment of the disclosure, the dielectric support layer comprises a dielectric body part and a dielectric protruding part, the dielectric body part extends along the first direction, and the dielectric protruding part protrudes from the dielectric body part in the second direction away from the carrier substrate and toward the piezoelectric layer.

In the bulk acoustic wave resonator according to an embodiment of the disclosure, the boundary layer comprises a boundary body part and a boundary protruding part, the boundary body part extends along the first direction, and the boundary body part and the dielectric body part constitute the body part of the cavity boundary structure, the boundary protruding part is located on sidewalls of the dielectric protruding part and a surface of the dielectric protruding part away from the carrier substrate, the boundary protruding part and the dielectric protruding part constitute the protruding part of the cavity boundary structure.

In the bulk acoustic wave resonator according to an embodiment of the disclosure, the boundary protruding part has a dual-wall structure, and comprises an inner wall part, an outer wall part, and a connecting part, the inner wall part and the outer wall part are connected to each other through the connecting part; the dielectric protruding part is filled between the inner wall part and the outer wall part of the boundary protruding part in the first direction, and the connecting part is located between the dielectric protruding part and the piezoelectric layer in the second direction.

In the bulk acoustic wave resonator according to an embodiment of the disclosure, the carrier substrate and the cavity boundary structure are bonded to and in direct contact with each other.

In the bulk acoustic wave resonator according to an embodiment of the disclosure, a material of the carrier substrate comprises at least one selected from the group consisting of monocrystalline silicon, polysilicon, amorphous silicon, glass, silicon carbide, gallium nitride, and aluminum oxide.

The bulk acoustic wave resonator according to an embodiment of the disclosure, further comprises: a charge accumulation preventing layer, disposed between the cavity boundary structure and the carrier substrate, the charge accumulation preventing layer is configured to avoid undesired conductive channel from being generated due to charge accumulation on a surface of the carrier substrate.

In the bulk acoustic wave resonator according to an embodiment of the disclosure, the carrier substrate is a semiconductor substrate, the charge accumulation preventing layer is in direct contact with the carrier substrate, and at least a surface layer of the charge accumulation preventing layer directly contacting the carrier substrate is a non-conductive and non-silicon-oxide layer.

In the bulk acoustic wave resonator according to an embodiment of the disclosure, at least the surface layer of the charge accumulation preventing layer directly contacting the carrier substrate comprises at least one selected from the group consisting of polysilicon, amorphous silicon, silicon nitride, silicon carbide, aluminum oxide and gallium nitride.

In the bulk acoustic wave resonator according to an embodiment of the disclosure, a contact interface between the carrier substrate and the charge accumulation preventing layer does not include silicon oxide.

In the bulk acoustic wave resonator according to an embodiment of the disclosure, the charge accumulation preventing layer comprises a barrier layer, the barrier layer is disposed on a side of the carrier substrate close to the cavity boundary structure, and is in direct contact with the carrier substrate.

In the bulk acoustic wave resonator according to an embodiment of the disclosure, the barrier layer is a single-layer structure, and a material of the harrier layer comprises at least one selected from the group consisting of polysilicon, amorphous silicon, silicon nitride, silicon carbide, aluminum nitride, and gallium nitride.

In the bulk acoustic wave resonator according to an embodiment of the disclosure, the barrier layer is a multi-layer structure, and the barrier layer comprises a stack layer comprising at least two selected from the group consisting of polysilicon, amorphous silicon, silicon nitride, silicon carbide, aluminum nitride, gallium nitride and silicon oxide, and wherein a surface layer of the barrier layer in direct contact with the carrier substrate does not include silicon oxide.

The bulk acoustic wave resonator according to an embodiment of the disclosure further comprises: a buffer layer, disposed on a side of the barrier layer away from the carrier substrate, and between the barrier layer and the cavity boundary structure.

In the bulk acoustic wave resonator according to an embodiment of the disclosure, a material of the buffer layer comprises at least one selected from the group consisting of silicon nitride, silicon oxide, aluminum nitride, polysilicon, and amorphous silicon.

In the bulk acoustic wave resonator according to an embodiment of the disclosure, one of a material of the buffer layer and a material of the barrier layer has tensile stress, and the other one of the material of the buffer layer and the material of the barrier layer has compressive stress, so as to be configured to balance a warpage of the carrier substrate.

In the bulk acoustic wave resonator according to an embodiment of the disclosure, the cavity boundary structure comprises a boundary layer and a dielectric support layer located on a side of the boundary layer adjacent to the carrier substrate, wherein the buffer layer and the dielectric support layer of the cavity boundary structure are bonded to each other.

The bulk acoustic wave resonator according to an embodiment of the disclosure further comprises: a first bonding layer, disposed on a side of the cavity boundary structure close to the carrier substrate, a second bonding layer, disposed on a side of the buffer layer close to the cavity boundary structure, the first bonding layer and the second bonding layer are bonded to each other.

In the bulk acoustic wave resonator according to an embodiment of the disclosure, the first bonding layer and the second bonding layer comprise amorphous silicon.

The bulk acoustic wave resonator according to an embodiment of the disclosure further comprises: a bonding layer, disposed on a side of the cavity boundary structure close to the carrier substrate, and the bonding layer and the buffer layer are bonded to each other.

In the bulk acoustic wave resonator according to an embodiment of the disclosure, the bonding layer comprises amorphous silicon, and the buffer layer comprises at least one selected from the group consisting of silicon nitride, silicon oxide, aluminum nitride, polysilicon, and amorphous silicon, and at least a surface layer of the buffer layer bonded to the bonding layer comprises polysilicon or amorphous silicon.

The bulk acoustic wave resonator according to an embodiment of the disclosure further comprises: a bonding layer, the bonding layer is disposed on a side of the cavity boundary structure close to the carrier substrate, and the bonding layer and the barrier layer are bonded to each other.

The bulk acoustic wave resonator according to an embodiment of the disclosure further comprises: a first bonding layer, disposed on a side of the cavity boundary structure close to the carrier substrate, a second bonding layer, disposed on a side of the barrier layer close to the cavity boundary structure, and the first bonding layer and the second bonding layer are bonded to each other.

In the bulk acoustic wave resonator according to an embodiment of the disclosure, the barrier layer and the cavity boundary structure are bonded to each other.

The bulk acoustic wave resonator according to an embodiment of the disclosure, further comprises: a bonding layer, disposed between the carrier substrate and the cavity boundary structure and serving as the charge accumulation preventing layer.

In the bulk acoustic wave resonator according to an embodiment of the disclosure, the bonding layer is disposed on a side of the cavity boundary structure close to the carrier substrate, and the bonding layer and the carrier substrate are bonded to each other.

In the bulk acoustic wave resonator according to an embodiment of the disclosure, the bonding layer comprises: a first bonding layer, disposed on a side of the cavity boundary structure close to the carrier substrate, a second bonding layer, disposed on a side of the carrier substrate close to the cavity boundary structure and serving as the charge accumulation preventing layer, wherein the first bonding layer and the second bonding layer are bonded to each other.

In the bulk acoustic wave resonator according to an embodiment of the disclosure, the periphery dielectric layer comprises a first material, and at least the portion of the cavity boundary structure adjacent to the periphery dielectric layer comprises a second material, and the first material and the second material are configured such that an etchant used in an etching process for forming the resonant cavity has an etching selectivity ratio of the first material to the second material.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1A to FIG. 1I are schematic cross-sectional views illustrating bulk acoustic wave resonators according to some embodiments of the present disclosure.

FIG. 2A to FIG. 2K are schematic cross-sectional views illustrating a method of forming a bulk acoustic wave resonator according to some embodiments of the present disclosure.

DETAILED DESCRIPTION

Figure 1A:
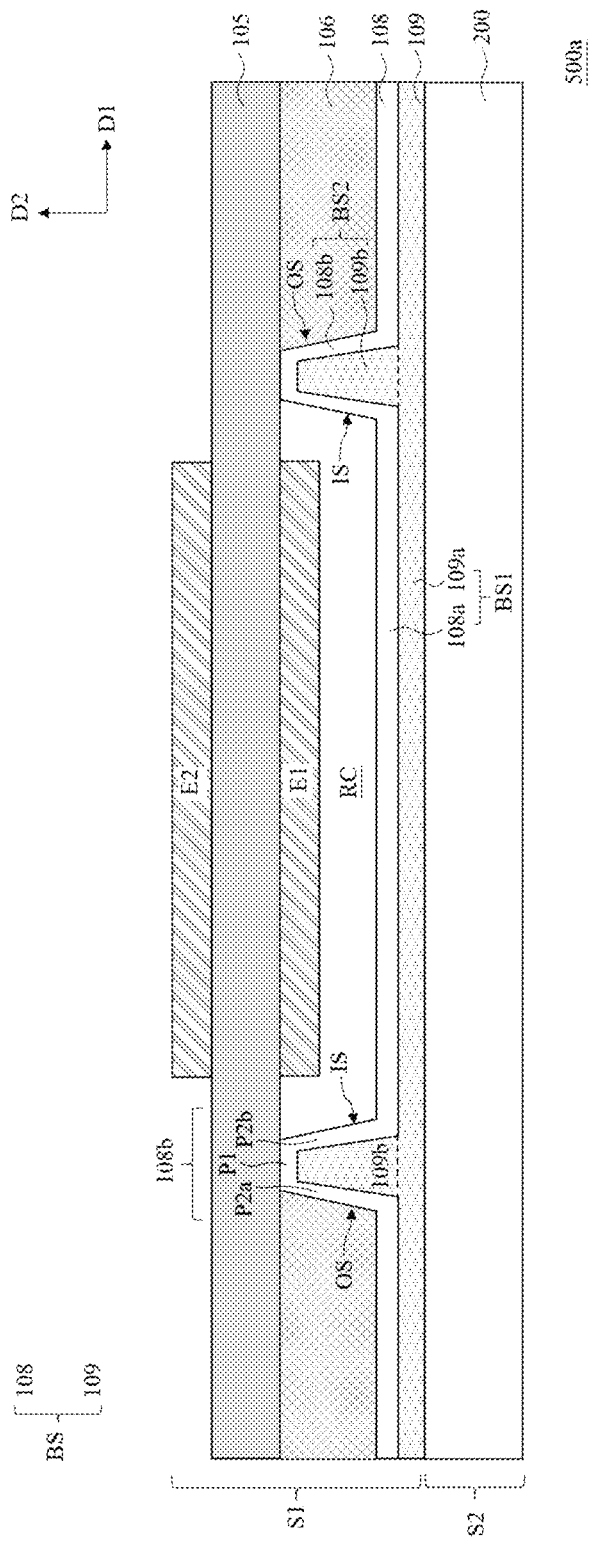

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the invention.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

In the bulk acoustic wave resonators provided by various embodiments of the present disclosure, a cavity boundary structure is formed on a side of the piezoelectric layer, and a resonant cavity is enclosed and defined by the piezoelectric layer and the cavity boundary structure. The cavity boundary structure has a body part and a protruding part, the resonant cavity is surrounded by the protruding part and is defined by the inner sidewall of the protruding part in a first direction (e.g., horizontal direction), and is defined between the body part of the cavity boundary structure and the piezoelectric layer in a second direction (e.g., a vertical direction) intersecting the first direction. A periphery dielectric layer is disposed outside the outer sidewall of the protruding part of the cavity boundary structure and surrounds the protruding part. Such a configuration can improve the mechanical support strength of the cavity boundary structure, thereby improving the performance of the resonator. In addition, in some embodiments, the cavity boundary structure adopts a bilayer structure and includes a boundary layer and a dielectric support layer, the boundary layer is disposed as a dual-wall structure having an inner wall part and an outer wall part, and a portion of the dielectric support layer is filled between the inner wall part and the outer wall part of the boundary layer, such a configuration can further increase the mechanical support strength of the cavity boundary structure, thereby improving the performance of the resonator. On the other hand, the cavity boundary structure adopts the bilayer structure, the boundary layer is configured to define the resonant cavity, and serves as an etch stop layer during the etching process for forming the resonant cavity, and the dielectric support layer is configured to be bonded to a carrier substrate or a material layer formed on the carrier substrate, and has a material suitable for bonding; during the etching process, the boundary layer separates the dielectric support layer apart from the etchant, as such, the dielectric support layer would not be corroded by the etch process; and the materials of the boundary layer and the dielectric support layer can thus be respectively selected to meet the respective requirements of the etching process and the bonding process, which is not necessary to satisfy the requirements of both the etching process and the bonding process. Therefore, the choices of materials are more abundant, and the materials more suitable for the respective processes can be selected respectively.

In addition, in some embodiments, a charge accumulation preventing layer is formed on the surface of the carrier substrate, alternatively, a material layer bonded to the carrier substrate is configured as a charge accumulation preventing layer. Further, before the charge accumulation preventing layer is formed on the carrier substrate or before boding the carrier substrate, a cleaning process is performed on the carrier substrate to remove a native oxide layer that may be existed on the surface of the carrier substrate. Through disposing the charge accumulation preventing layer and removing the native oxide layer, the generation of undesired conductive channel due to charge accumulation on the surface of the carrier substrate can be avoided, such a configuration can avoid the radio frequency loss of the resonator, thereby improving the quality factor (Q) of the resonator.

In the embodiments of the present disclosure, the piezoelectric layer and electrodes on opposite sides of the piezoelectric layer constitute a resonant structure, while the cavity boundary structure, the periphery dielectric layer, and the carrier substrate constitute a resonant carrier, and in some embodiments, the resonant carrier further includes other material layers (e.g., a charge accumulation preventing layer) between the cavity boundary structure and the carrier substrate. The resonant structure and the resonant carrier enclose to form a resonant cavity. In the embodiments of the present disclosure, through the above-described configuration of the cavity boundary structure, the mechanical support strength of the resonant carrier is improved, in the embodiments provided with the charge accumulation preventing layer, the performance of the resonant carrier is further improved, thereby improving the quality factor of the resonator, and further improving the performance of resonator and the filter formed thereof.

FIG. 1A is a schematic cross-sectional view illustrating a bulk acoustic wave resonator according to some embodiments of the present disclosure.

Referring to FIG. 1A, in some embodiments, a bulk acoustic wave resonator 500a includes a sub-resonator structure S1 and a sub-resonator structure S2, the sub-resonator structure S1 is disposed on and bonded to the sub-resonator structure S2. In some embodiments, the sub-resonator structure S1 includes a piezoelectric layer 105, an electrode E1 and an electrode E2 formed on opposite sides of the piezoelectric layer 105, a periphery dielectric layer 106, and a cavity boundary structure BS; the resonator structure S2 may include a carrier substrate 200. In addition, the bulk acoustic wave resonator 500a further includes a cavity RC. In some embodiments, the cavity RC is disposed in the sub-resonator structure S1 and is defined by the cavity boundary structure BS and the piezoelectric layer 105. However, the present disclosure is not limited thereto.

In some embodiments, the carrier substrate 200 may include a non-conductive material such as a semiconductor material, an insulating material, or a combination thereof. In some embodiments, the carrier substrate 200 is a semiconductor substrate, and may include a suitable semiconductor material such as silicon. For example, the material of the carrier substrate 200 may include a semiconductor material such as monocrystalline silicon, polysilicon, amorphous silicon, silicon carbide, gallium nitride, the like, or combinations thereof, but the present disclosure is not limited thereto. Alternatively or additionally, the carrier substrate 200 may also include a non-conductive material, such as an insulating material such as glass, aluminum oxide, or the like. The carrier substrate 200 has a main surface or a top surface extending along a direction D1 (e.g., a horizontal direction). That is, the direction D1 is the extending direction of the main surface of the carrier substrate 200 or is parallel to the main surface of the carrier substrate 200. In some embodiments, the direction D1 does not only refer to a single horizontal direction, but may include multiple horizontal directions or any horizontal directions along or parallel to the main surface of carder substrate 200; that is, the direction D1 may be or may include a horizontal direction along any direction. For example, in addition to the horizontal direction indicated by the arrow in FIG. 1A, the direction D1 may further include the horizontal direction perpendicular to the paper surface.

In some embodiments, the piezoelectric layer 105 includes a suitable piezoelectric material, such as aluminum nitride (AlN), scandium-doped aluminum nitride (ScAlN), zinc oxide, lithium niobate, lithium tantalate, or the like material having piezoelectric property, but the present disclosure is not limited thereto. The electrode E1 and the electrode E2 are disposed on opposite sides of piezoelectric layer 105 in the direction D2. The direction D2 intersects the direction D1, for example, the direction D2 and the direction D1 are substantially perpendicular to each other, i.e., the direction D2 is substantially perpendicular to the main surface (e.g., the top surface) of the carrier substrate 200. In some embodiments, the direction D1 may be referred to as a first direction or a horizontal direction, and the direction D2 may be referred to as a second direction or a vertical direction. In some embodiments, the electrode E1 is disposed on a side of the piezoelectric layer 105 close to the carrier substrate 200, and the electrode E2 is disposed on a side of the piezoelectric layer 105 away from the carrier substrate 200; the electrode E1 and the electrode E2 may be referred to as a first electrode and a second electrode, respectively, or vice versa. The electrodes E1 and E2 may each include a suitable electrode material, including, for example, a metallic material such as molybdenum (Mo), aluminum (Al), copper (Cu), platinum (Pt), tantalum (Ta), tungsten (W), Palladium (Pd), Ruthenium (Ru), the like, alloys thereof, or combinations thereof.

In some embodiments, the periphery dielectric layer 106 is disposed on the side of the piezoelectric layer 105 away from the electrode E2 and close to the sub-resonator structure S2. The periphery dielectric layer 106 and the electrode E1 are disposed on the same side of the piezoelectric layer 105. The periphery dielectric layer 106 includes a non-conductive material, and may be a single-layer structure or a stack layer including two or more layers of non-conductive materials. For example, the periphery dielectric layer 106 may include a dielectric material such as silicon oxide ($SiO_2$), silicon nitride (SiN), aluminum nitride (AlN), the like, or combinations thereof.

Still referring to FIG. 1A, in some embodiments, the cavity boundary structure BS is disposed on the side of the piezoelectric layer 105 close to the sub-resonator structure S2 (e.g., the carrier substrate 200 thereof), and covers the sidewall of the periphery dielectric layer 106 toward the cavity RC and the surface of the periphery dielectric layer 106 at the side away from the piezoelectric layer 105 and close to the sub-resonator structure S2. The cavity boundary structure BS is configured to define the cavity RC. For example, the cavity RC is defined by the cavity boundary structure BS and the piezoelectric layer 105, for example, defined by an inner sidewall IS of the cavity boundary structure BS and facing surfaces of the cavity boundary structure BS and the piezoelectric layer 105. Herein, "facing surfaces" refers to surfaces that face each other. In some embodiments, the cavity boundary structure BS includes a body part BS1 and a protruding part BS2. The body part BS1 extends, for example, along a direction (e.g., the direction D1) parallel to the main surface of the carrier substrate 200 (e.g., the top surface at the side close to the sub-resonator structure S1 in FIG. 1A), and is located between the cavity RC and the carrier substrate 200, and between the periphery dielectric layer 106 and the carrier substrate 200. The protruding part BS2 protrudes from the surface of the body part BS1 at the side close to the piezoelectric layer 105 in a direction (e.g., the direction D2) perpendicular to the main surface of the carrier substrate 200 away from the carrier substrate 200 of the sub-resonator structure S2 and toward the piezoelectric layer 105.

In some embodiments, when viewed in a plan view, the protruding part BS2 is ring-shaped, and has the inner sidewall IS and an outer sidewall OS opposite to each other in the horizontal direction (e.g., the direction D1); the protruding part BS2 laterally surrounds and defines the cavity RC in the horizontal direction (e.g., the direction D1), a portion (e.g., a first portion) of the body part BS1 is located in a region between the protruding part BS2 (e.g., the inner sidewall IS thereof) in the direction D1, another portion (e.g., a second portion) of the body part BS1 is located on a side of the protruding part BS2 close to the outer sidewall OS thereof in the direction D1. The inner sidewall IS of the protruding part BS2, the surface of the first portion of the body part BS1 facing the piezoelectric layer 105, and the surface of the piezoelectric layer 105 facing the first portion of the body part BS1 enclose to define the cavity RC; the protruding part BS2 is located between the cavity RC and the periphery dielectric layer 106 in the direction D1 and separates the cavity RC and the periphery dielectric layer 106 apart from each other. The outer sidewall OS of the protruding part BS2 is in contact with the sidewall of the periphery dielectric layer 106 at the side close to the cavity RC. In some embodiments, the dielectric layer 106 is also ring-shaped, and laterally surrounds the protruding part BS2 of the cavity boundary structure BS in the horizontal direction (e.g., direction D1). The second portion of the body part BS1 of the cavity boundary structure BS is disposed between the dielectric layer 106 and the sub-resonator structure S2 (e.g., the carrier substrate 200 thereof) in the direction D2, and covers the surface of the dielectric layer 106 at a side away from the piezoelectric layer 105 and close to the sub-resonator structure S2. That is to say, the dielectric layer 106 is located on the side of the protruding part BS2 of the cavity boundary structure BS away from the cavity RC and close to the outer sidewall OS of the protruding part BS2 in the direction D1, and is located between a portion (e.g., the second portion) of the body part BS1 of the cavity boundary structure BS and the piezoelectric layer 105 in the direction D2.

The cavity boundary structure BS includes a material different from the periphery dielectric layer 106, the cavity boundary structure BS may be a single-layer structure or a multi-layer structure, and at least a material of a layer (i.e., a portion adjacent to the periphery dielectric layer 106) of the cavity boundary structure BS contacting the dielectric layer 106 is different from the material of the dielectric layer 106. For example, the cavity boundary structure BS may be a bilayer structure and may include a boundary layer 108 and a dielectric support layer 109. The materials of boundary layer 108 and the dielectric support layer 109 may be the same or different. For example, the boundary layer 108 and the dielectric support layer 109 include different materials, the material of the boundary layer 108 is different from the material of the periphery dielectric layer 106, and the material of the dielectric support layer 109 may be the same as or different from the material of the periphery dielectric layer 106. The boundary layer 108 may include a semiconductor material, a dielectric material, the like, or combinations thereof. In some embodiments, the material of the boundary layer 108 is a material that is not corroded by hydrofluoric acid. For example, the boundary layer 108 may include polysilicon, amorphous silicon (α-Si), gallium nitride (GaN), aluminum nitride (AlN), silicon nitride (SiN), tantalum nitride (TaN), the like, or combinations thereof. The material of the dielectric support layer 109 includes, for example, anon-conductive material such as silicon oxide, and the dielectric support layer 109 may be a single-layer structure or a multi-layer structure (e.g., a stack layer including two or more layers).

In some embodiments, the boundary layer 108 is disposed on the side of the piezoelectric layer 105 close to the sub-resonator structure S2 (e.g., the carrier substrate 200 thereof), and covers the sidewall of the periphery dielectric layer 106 toward the cavity RC and the surface of the periphery dielectric layer 106 at the side away from the piezoelectric layer 105 and close to the sub-resonator structure S2. The inner sidewall IS and the outer sidewall OS of the cavity boundary structure BS and the surface of the cavity boundary structure BS at the side away from the sub-resonator structure S2 and close to the piezoelectric layer 105 are the corresponding sidewalk and surface of the boundary layer 108. In some embodiments, the dielectric support layer 109 is disposed on the side of the boundary layer 108 away from the piezoelectric layer 105 and close to the sub-resonator structure S2 (e.g., the carrier substrate 200 thereof), and is disposed between the boundary layer 108 and the carrier substrate 200. The dielectric support layer 109 is in direct contact with the boundary layer 108, and may be in direct contact with the carrier substrate 200, but the present disclosure is not limited thereto.

Still referring to FIG. 1A, in some embodiments, the dielectric support layer 109 has a dielectric body part 109a and a dielectric protruding part 109b; the dielectric body part 109a extends along the direction D1 substantially parallel to the main surface of the carrier substrate 200 and covers the main surface of the carrier substrate 200; the dielectric protruding part 109b protrudes from the dielectric body part 109a in the direction D2 substantially perpendicular to the main surface of the substrate 200 away from the carrier substrate 200 and toward the piezoelectric layer 105.

The boundary layer 108 extends along the surface of the dielectric support layer 109 (i.e., the surface of the dielectric body part 109a at the side away from the sub-resonator structure S2 and close to the piezoelectric layer 105, the sidewalls of the dielectric protruding part 109b, and the surface (e.g., top surface) of the dielectric protruding part 109b at the side close to the piezoelectric layer 105), and includes a boundary body part 108a and a boundary protruding part 108b; the boundary body part 108a extends along the top surface of the dielectric body part in the direction D1; the boundary protruding part 108b extends along the sidewalls of dielectric protruding part 109b and the surface of the dielectric protruding part 109b at the side close to piezoelectric layer 105. The boundary protruding part 108b protrudes from the boundary body part 108a in the direction D2 perpendicular to the main surface of the carrier substrate 200 away from the carrier substrate 200 and toward the piezoelectric layer 105. The boundary body part 108a and the dielectric body part 109a together constitute the body part BS1 of the cavity boundary structure BS; the boundary protruding part 108b and the dielectric protruding part 109b together constitute the protruding part BS2 of the cavity boundary structure BS. In some embodiments, the dielectric protruding part 109b and the boundary protruding part 108b are portions of the material of the dielectric layer and the material of the boundary layer that are filled in the trench of the dielectric layer 106 during the manufacturing process, which will be discussed in detail later with reference to the manufacturing process.

Still referring to FIG. 1A, the periphery dielectric layer 106 is located between the boundary body part 108a and the piezoelectric layer 105 and outside the boundary protruding part 108b, that is, the periphery dielectric layer 106 is located on a side of the boundary protruding part 108b close to the outer sidewall OS away from the cavity 30 in the horizontal direction (e.g., direction D1). The boundary protruding part 108b includes an outer wall part P2a, an inner wall part P2b and a connecting part P1. The outer wall part P2a covers the outer sidewall of the dielectric protruding part 109b and is sandwiched between the outer sidewall of the dielectric protruding part 109b and the periphery dielectric layer 106; the inner wall part P2b covers the inner sidewall of the dielectric protruding part 109b, and the inner wall part P2b and the outer wall part P2a are opposite to each other in the horizontal direction (e.g., the direction D1); the connecting part P1 connects the outer wall part P2a and the inner wall part P2b, and covers the surface of the dielectric protruding part 109b at the side close to the piezoelectric layer 105, and is located between the dielectric protruding part 109b and the piezoelectric layer 105. Herein, the outer sidewall of the dielectric protruding part 109b and the outer wall part P2a of the boundary protruding part 108b respectively refer to the sidewall/part thereof that are away from the cavity RC and close to or facing the periphery dielectric layer 106, and the inner sidewall of the dielectric protruding part 109b and the inner wall part P2b of the boundary protruding part 108b respectively refer to the sidewall/part thereof that are opposite to the aforementioned outer sidewall/outer wall part and close to or facing the cavity RC. In some embodiments, such a structure of the boundary layer 108 including the outer wall part P2a and the inner wall part P2b is referred to as a dual-sidewall structure or a dual-wall structure, and the outer wall part P2a and the inner wall part P2b may be referred to as the two walls of the dual-wall structure, respectively. The dielectric protruding part 109b is filled between the outer wall part and the inner wall part of the boundary protruding part 108b in the horizontal direction (e.g., direction D1). In the embodiments of the present disclosure, the sub-resonator structure S2 at least including the carrier substrate 200, the cavity boundary structure BS and the periphery dielectric layer 106 may together serve as a resonant carrier; such a configuration can improve the structural support strength of the resonant carrier. In some embodiments, through forming the cavity boundary structure BS as including the boundary layer having dual-wall structure and the dielectric support layer having a portion filled in the dual-wall structure, the structural support strength of the cavity boundary structure can be further improved, thereby further improving the structural support strength of the resonant carrier, and further improving the performance of the bulk acoustic wave resonator and the filter formed therefrom.

In some embodiments, in the example illustrated in FIG. 1A, in the case where the material of the carrier substrate 200 is monocrystalline silicon, and the material of the dielectric support layer 109 directly contacting the carrier substrate 200 is silicon oxide, since silicon oxide is naturally rich in electrons, and is an electron-rich material; in the case where the monocrystalline silicon material and the silicon oxide material are bonded together, mnonocrystalline silicon may capture electrons in silicon oxide, which may cause charge accumulation at the contact interface between the silicon oxide and the monocrystalline silicon and generate a conductive channel. Such a conductive channel may cause radio frequency loss in the bulk acoustic wave resonator or electronic device (e.g., filter) including the same, which may degrade the performance of the bulk acoustic wave resonator/electronic device (e.g., resonator/filter).

Therefore, in the case where the structure illustrated in FIG. 1A is adopted, suitable materials may be selected to form the carrier substrate 200 and the dielectric support layer 109, such that the materials of the carrier substrate 200 and the dielectric support layer 109 can be bonded to each other, and charges can be avoided from being accumulated at the contact interface therebetween, thereby avoiding the generation of undesired conductive channel. For example, in the case where the material of the dielectric support layer 109 is an electron-rich dielectric material such as silicon oxide, the material of the carrier substrate 200 is selected from a non-monocrystalline-silicon-based non-conductive material, such as a semiconductor material such as polysilicon, amorphous silicon, silicon carbide, gallium nitride and/or an insulating material such as silicon nitride, glass, or the like. In this case, since the carrier substrate 200 uses a non-monocrystalline-silicon-based non-conductive material, there is no contact interface between monocrystalline silicon and a dielectric material such as silicon oxide existed between the carrier substrate 200 and the dielectric support layer 109; alternatively, in the case where the carrier substrate 200 uses a monocrystalline silicon material, the dielectric support layer 109 selects a non-electron-rich dielectric material. In this way, the carrier substrate 200 capturing electrons from the material of the dielectric support layer 109 can be avoided, thereby avoiding the generation of undesired conductive channel due to charge accumulation on the surface of the carrier substrate 200, which can improve the quality factor (Q) of the bulk acoustic wave resonator 500a.

FIG. 1B to FIG. 1I are schematic cross-sectional views illustrating bulk acoustic wave resonators according to some other embodiments of the present disclosure. The bulk acoustic wave resonators 500b-500i illustrated in FIG. 1B to FIG. 1I are similar to the bulk acoustic wave resonator 500a illustrated in FIG. 1A, except that the sub-resonator structure S1 and/or the sub-resonator structure S2 further include other material layers between the carrier substrate 200 and the cavity boundary structure BS, the differences will be described in detail below, while features similar to the above-described embodiment will not be repeated. It should be noted that, the same or similar reference numerals are used to denote the same or similar elements in various embodiments, and the candidate materials used for the elements denoted by the same or similar reference numerals in various embodiments are the same or similar, and the related materials are not repeatedly described in each embodiment, but may refer to those described in previous embodiments.

Figure 1B:
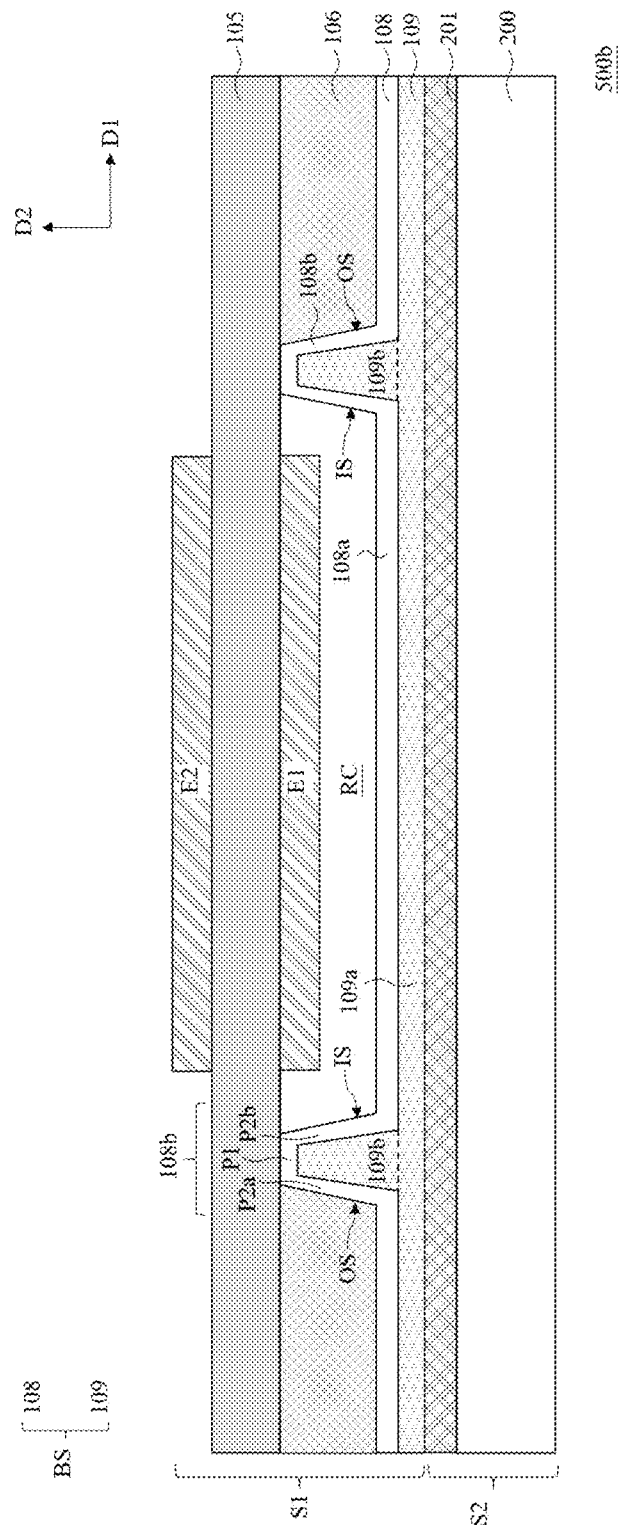

Referring to FIG. 1B, in some embodiments, the bulk acoustic wave resonator 500b includes a sub-resonator structure S1 and a sub-resonator structure S2, the sub-resonator structure S1 is similar to that described with reference to FIG. 1A, while the sub-resonator structure S2 further includes a barrier layer 201 disposed on the carrier substrate 200. The barrier layer 201 may be disposed on a side of the carrier substrate 200 close to the sub-resonator structure S1, and may be disposed between the carrier substrate 200 and the dielectric support layer 109 of the cavity boundary structure BS, for example. The barrier layer 201 may serve as a charge accumulation preventing layer and is configured to avoid charges from being accumulated on the surface of the carrier substrate 200, and thus avoid the generation of undesired conductive channel. The barrier layer 201 may be a single-layer structure or a multi-layer structure (or referred to as a stacked structure) including at least two layers of materials. In some embodiments, at least the surface layer of the barrier layer 201 contacting the carrier substrate 200 is a non-electron-rich layer, such as a non-conductive and non-silicon-oxide layer. For example, the barrier layer 201 includes a non-conductive material, and may include, for example, a semiconductor material, a dielectric material, or a combination thereof. For example, the barrier layer 201 may include polysilicon, amorphous silicon, silicon nitride (SiN), aluminum nitride (AlN), silicon carbide (SiC), gallium nitride (GaN), silicon oxide, the like, or combinations thereof. In the case where the barrier layer 201 is a single-layer structure, the material of the barrier layer 201 does not include silicon oxide, that is, may be selected from the above-mentioned materials other than silicon oxide; in the case where the barrier layer 201 is a multi-layer structure, a material layer of the barrier layer 201 in contact with the carrier substrate 200 does not include silicon oxide, $SiO_x$, or the like, that is, may be selected from the above-mentioned materials other than silicon oxide, while the other layers of the barrier layer 201 (e.g., the layer away from the main surface of the carrier substrate 200 without directly contacting the carrier substrate 200) may be selected from any of the above-mentioned materials, and may include silicon oxide, $SiO_x$, or the like. However, the present disclosure is not limited thereto, and any material that can avoid the formation of charge accumulation and avoid the generation of undesired conductive channel on the surface of the carrier substrate 200 can be used to form the barrier layer 201 and is within the scope of the embodiments of the present disclosure.

In some embodiments, there is free of silicon oxide layer, $SiO_x$ layer, silicon-oxide-based material, $SiO_x$-based material, or similar material between the carrier substrate 200 and the barrier layer 201. For example, the barrier layer 201 is in direct contact (or physical contact) with the carrier substrate 200, that is, no other material layer is included between the carrier substrate 200 and the barrier layer 201. That is to say, at least there is free of silicon oxide or $SiO_x$-based material on the main surface (e.g., the top surface) of the carrier substrate 200. In some embodiments, before the barrier layer 201 is formed on the carrier substrate 200, a cleaning process is performed on the carrier substrate 200 to remove (e.g., completely remove) a native oxide layer (e.g., native silicon oxide) that may be existed on the surface of carrier substrate 200, so as to ensure that there is no contact interface between monocrvstalline silicon and silicon oxide existed on the surface of the carrier substrate 200 in the case where the carrier substrate 200 is formed of monocrystalline silicon material.

In this embodiment, since the barrier layer 201 serves as the charge accumulation preventing layer the choices for the material of the carrier substrate 200 can be relatively unrestricted, for example, the carrier substrate 200 can use a monocrystalline silicon substrate. In some examples, the carrier substrate 200 may be or include a high resistance silicon material. Further, since the barrier layer 201 is disposed between the carrier substrate 200 and the dielectric support layer 109, and separates the carrier substrate 200 and the dielectric support layer 109 apart from each other, the material of the dielectric support layer 109 does not adversely affect the carrier substrate 200. Therefore, the material of the dielectric support layer 109 can be chose without considering the impact thereof on the carrier substrate 200, and the choices for the material of the dielectric support layer 109 is thus relatively unrestricted; for example, in the case where the carrier substrate 200 includes monocrystalline silicon, the dielectric support layer 109 may also be or include a silicon oxide material. The barrier layer 201 can avoid the surface of the carrier substrate 200 from contacting the electron-rich material (e.g., silicon oxide) to form a contact interface between a semiconductor material and an electron-rich material (e.g., a contact interface between monocrystalline silicon and silicon oxide) that may generate charge accumulation, thereby avoiding the generation of undesired conductive channel due to charge accumulation on the surface of the carrier substrate 200, and further improving the performance of the bulk acoustic wave resonator, such as improving the quality factor (Q) of the resonator.

In this embodiment, the sub-resonator structure S2 including the carrier substrate 200 and the barrier layer 201, the cavity boundary structure BS and the periphery dielectric layer 106 may together constitute a resonant carrier; through the structural configuration of the cavity boundary structure BS, the structural support strength of the resonant carrier can be improved. Further, through disposing the charge accumulation preventing layer, the quality of the resonant carrier is further improved, thereby improving the performance of the bulk acoustic wave resonator and the filter formed therefrom.

Figure 1C:
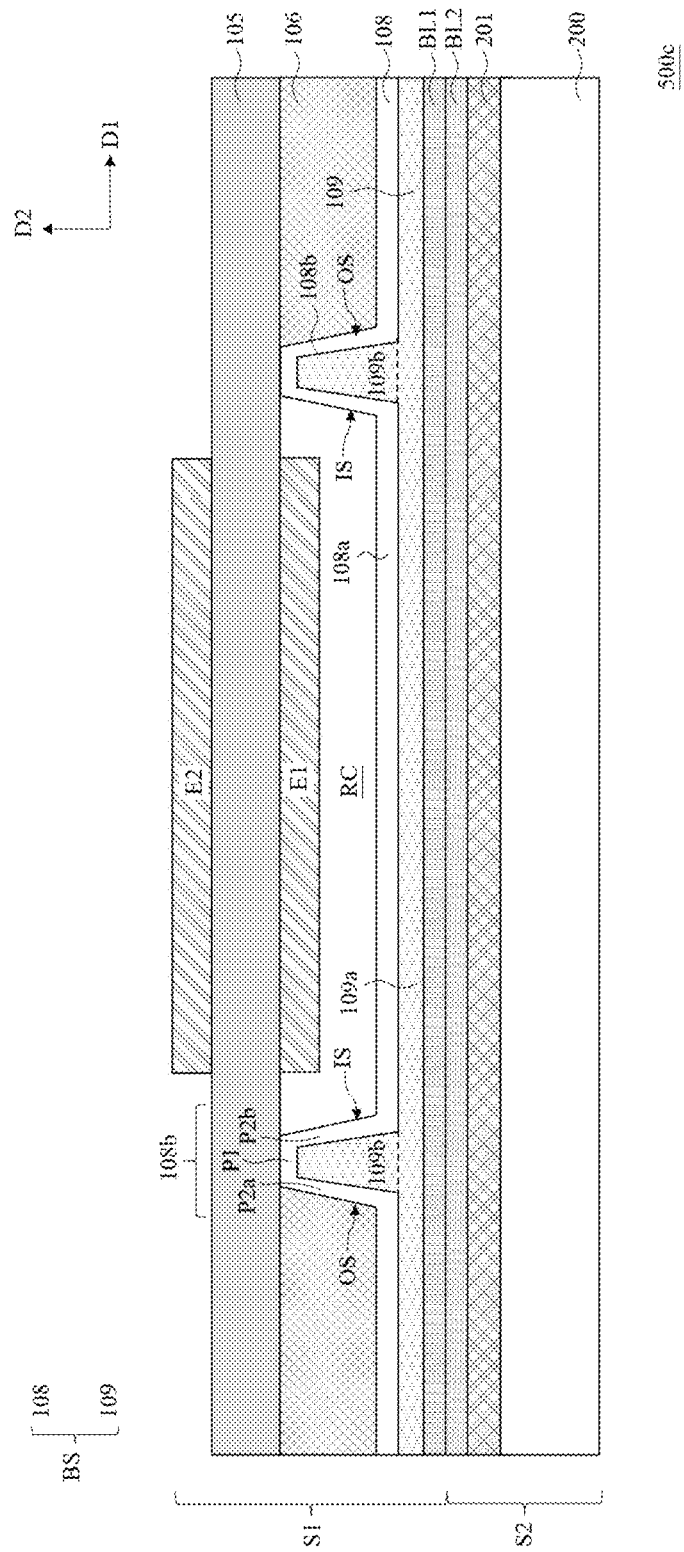

Referring to FIG. 1C, a bulk acoustic wave resonator 500c includes a sub-resonator structure S1 and a sub-resonator structure S2. In some embodiments, the sub-resonator structure S2 includes a carrier substrate 200, a barrier layer 201 and a bonding layer BL2, the barrier layer 201 is disposed on the surface of the carrier substrate 200 at a side close to the sub-resonator structure S1, and the bondinu layer BL2 is disposed on the side of the barrier layer 201 away from the carrier substrate 200; in addition, the sub-resonator structure S1 may further include a bonding layer BL1, and the bonding layer BL1 is disposed on the side of the dielectric support layer 109 of the cavity boundary structure BS away from the piezoelectric layer 105 and close to the sub-resonator structure S2. In some embodiments, the bonding layer BL1 and the bonding layer BL2 may each include a semiconductor material, such as amorphous silicon, but the present disclosure is not limited thereto.

In some embodiments, the barrier layer 201 serves as a charge accumulation preventing layer, and may be a single-layer structure or a multi-layer structure including at least two layers of materials. The candidate materials of the barrier layer 201 are similar to those described in the previous embodiment, which are not described again here. Through disposing the barrier layer 201, the surface of the carrier substrate 200 can be avoided from contacting electron-rich material (e.g., silicon oxide) to form a contact interface between a semiconductor material and all electron-rich material (e.g., contact interface between monocrystalline silicon and silicon oxide), thereby avoiding the generation of undesired conductive channel due to charge accumulation on the surface of the carrier substrate 200, thereby improving the performance of the bulk acoustic wave resonator, such as improving the quality factor of the resonator. In addition, through respectively disposing bonding layers BL1 and BL2 in the sub-resonator structures S1 and S2, the bonding quality of the sub-resonator structures S1 and S2 can be improved, thereby improving the performance of the bulk acoustic wave resonator.

In this embodiment, the sub-resonator structure S2 including the carrier substrate 200, the barrier layer 201 and the bonding layer BL2, and the cavity boundary structure BS, the periphery dielectric layer 106 and the bonding layer BL1 of the sub-resonator structure S1 together constitute the resonant carrier; through the structural configuration of the cavity boundary structure BS, the structural support strength of the resonant carrier can be improved. Further, through disposing the charge accumulation preventing layer, the quality of the resonant carrier is further improved, thereby improving the performance of the bulk acoustic wave resonator and the filter formed therefrom.

Figure 1D:
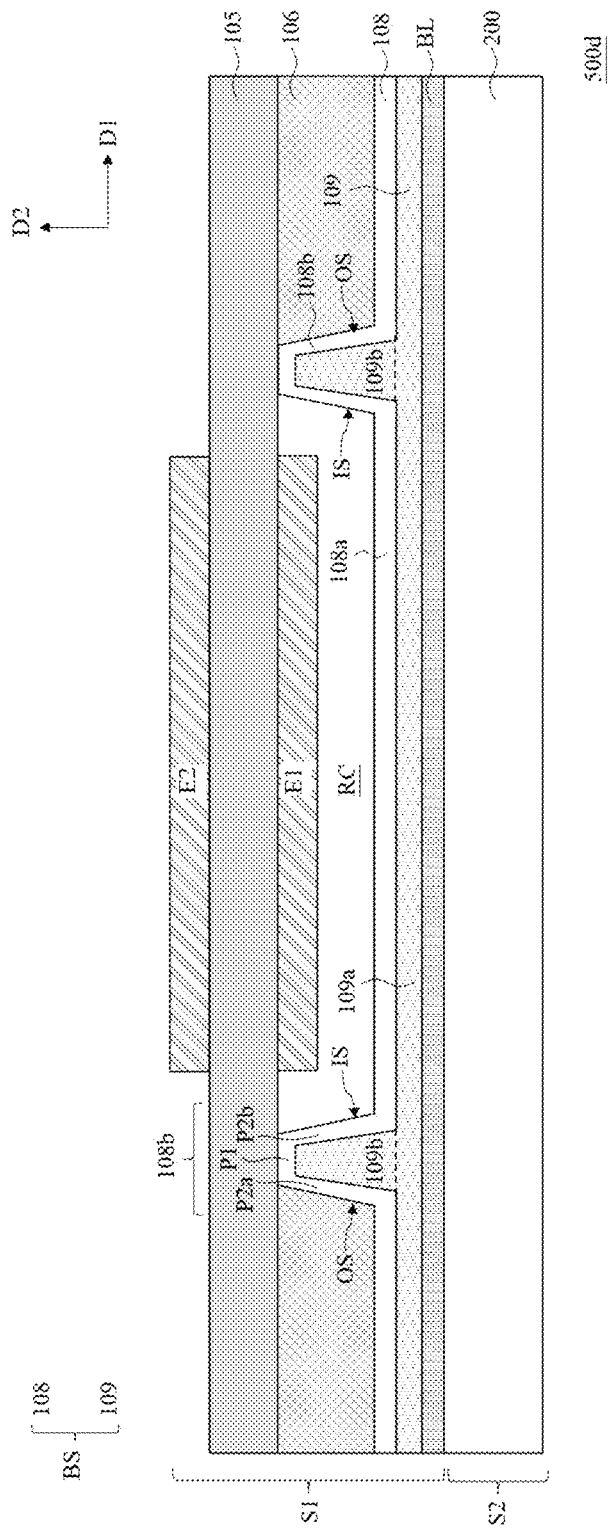

Referring to FIG. 1D, in some embodiments, the bulk acoustic wave resonator 500d includes sub-resonator structures S1 and S2, wherein either of the sub-resonator structures S1 and S2 may include a bonding layer. In this embodiment, the barrier layer 201 is omitted from the sub-resonator structure S2, and a bonding layer BL is disposed between the carrier substrate 200 and the dielectric support layer 109 of the cavity boundary structure BS. The bonding layer BL is disposed on the side of the dielectric support layer 109 of the cavity boundary structure BS close to the carrier substrate 200, and can be in direct contact with the carrier substrate 200, and there may be free of other material layers included between the bonding layer BL and the carrier substrate 200. In this embodiment, the bonding layer BL serves as the charge accumulation preventing layer, and the bonding layer BL includes a non-electron-rich material, at least a surface layer of the bonding layer BL contacting the carrier substrate 200 does not include electron-rich material, alternatively, the bonding layer BL does not include electron-rich material at all. The bonding layer BL may include a non-conductive material, and may include a semiconductor material, a dielectric material, or a combination thereof. For example, the bonding layer BL may include amorphous silicon. In this embodiment, the bonding layer BL serves as the charge accumulation preventing layer, electron-rich material (e.g., silicon oxide. $SiO_x$, or other silicon-oxide-based material) is not existed at least on the surface of bonding layer BL close to the carrier substrate 200 and between the bonding layer BL and the carrier substrate 200, and the bonding layer BL separates the carrier substrate 200 apart from an overlying layer that may include an electron-rich material (e.g., the dielectric support layer 109 that may include silicon oxide). That is to say, there is no contact interface between a semiconductor material and an electron-rich material (e.g., a contact interface between monocrystalline silicon and silicon oxide) that may cause charge accumulation existed on the surface of the carrier substrate 200, thereby avoiding the generation of undesired conductive channel due to charge accumulation on the surface of the carder substrate 200, and further improving the performance (e.g., quality factor) of the bulk acoustic wave resonator and filter. In this embodiment, the bonding layer BL serves as both the bonding material and the charge accumulation preventing layer. In some embodiments, the bonding layer BL may be a bonding layer included in either of the sub-resonator structures S1 and S2, for example, the bonding layer BL is included in the sub-resonator structure S1 and formed at the side of the cavity boundary structure BS of the sub-resonator S1 close to the sub-resonator structure S2; alternatively, in some other embodiments, the bonding layer BL may also be included in the sub-resonator structure S2 and is formed on the side of the carrier substrate 200 close to the sub-resonator structure S1.

In this embodiment, the carrier substrate 200, the bonding layer BL, the cavity boundary structure BS, and the periphery dielectric layer 106 may together constitute a resonant carrier; through the structure configuration of the cavity boundary structure BS, the structural support strength of the resonant carrier is improved; further, through disposing the charge accumulation preventing layer, the quality of the resonant carrier is further improved, thereby improving the performance of the bulk acoustic wave resonator and the filter formed therefrom.

Figure 1E:
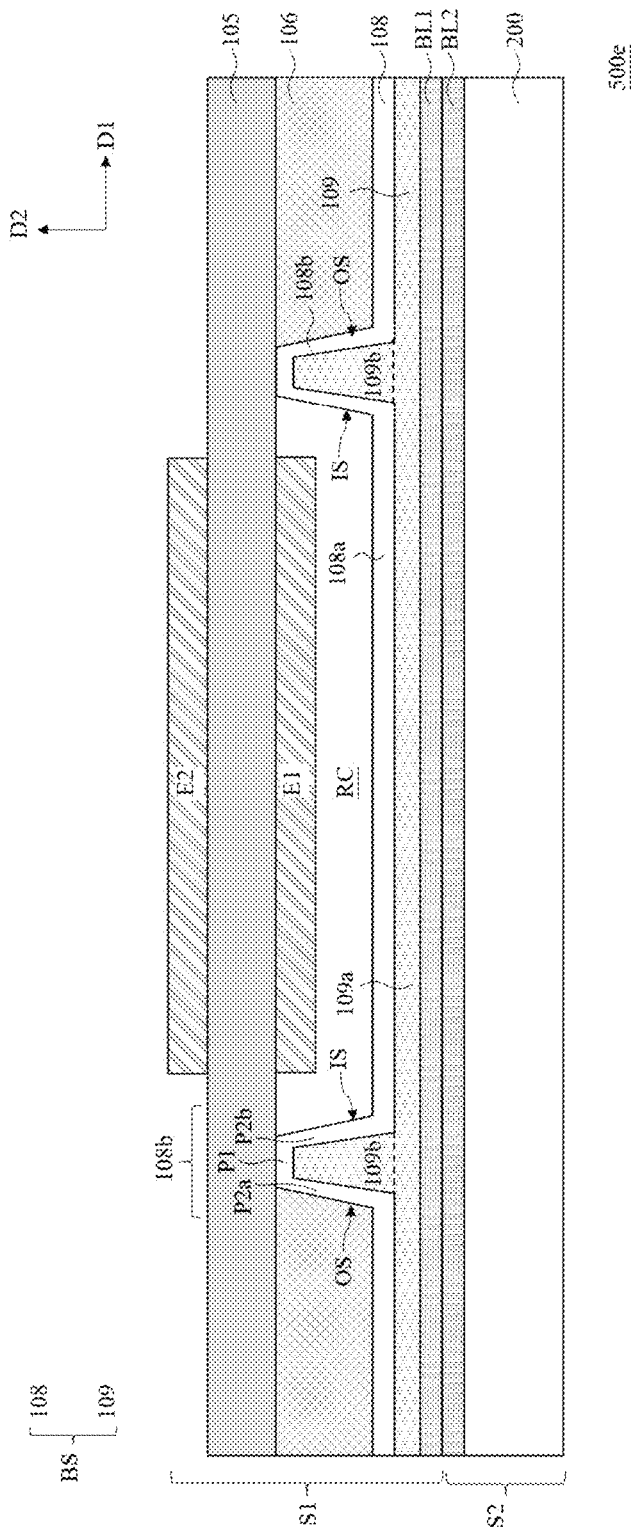

Referring to FIG. 1E, in some embodiments, the bulk acoustic wave resonator 500e includes sub-resonator structures S1 and S2, the barrier layer is omitted from the sub-resonator structure S2, and the sub-resonator structures S1 and S2 may respectively include a bonding layer BL1 and a bonding layer BL2. For example, the bonding layer BL1 and the bonding layer BL2 are disposed between the dielectric support layer 109 of the cavity boundary structure BS and the carrier substrate 200, the bonding layer BL1 is disposed on the side of the cavity boundary structure BS close to the sub-resonator structure S2, and the bondinu layer BL2 is disposed on the side of the carrier substrate 200 close to the sub-resonator structure S1. In this embodiment, the bonding layer BL2 is directly disposed on and in direct contact with the carrier substrate 200, and there may be free of other material layers included between the bonding layer BL2 and the carrier substrate 200. The function of the bonding layer BL2 is similar to that of the bonding layer BL in the semiconductor structure 500d illustrated in FIG. 1D. For example, the bonding layer BL2 serves as both a bonding material and a charge accumulation preventing layer. At least the surface layer of the bonding layer BL2 in contact with the carrier substrate 200 does not include an electron-rich material (e.g., silicon oxide), or the bonding layer BL2 does not include an electron-rich material at all, and the material of the bonding layer BL2 may be selected from the aforementioned candidate materials of the bonding layer BL in the bulk acoustic wave resonator 500d, and the materials of the bonding layer BL1 and the bonding layer BL2 may be the same or different. For example, the bonding layers BL1 and BL2 are non-conductive layers, and may include semiconductor materials, such as amorphous silicon, but the present disclosure is not limited thereto. In this embodiment, at least the surface layer of the bonding layer BL2 in contact with the carrier substrate 200 does not include an electron-rich material (e.g., silicon oxide layer, $SiO_x$ layer, or the like), and there has no electron-rich material (e.g., silicon oxide layer, $SiO_x$ layer, or the like) existed between the bonding layer BL2 and the carrier substrate 200. That is to say, there is no contact interface between a semiconductor material and an electron-rich material (e.g., a contact interface between monocrystalline silicon and silicon oxide) that may cause charge accumulation existed on the surface of the carrier substrate 200, therefore, the generation of undesired conductive channel due to charge accumulation on the surface of the carrier substrate 200 can be avoided, thereby improving the performance (e.g., quality factor) of bulk acoustic wave resonator and filter.

In this embodiment, the sub-resonator structure S2 including the carrier substrate 200 and the bonding layer BL2, and the cavity boundary structure BS1, the periphery dielectric layer 106 and the bonding layer BL1 of the sub-resonator structure S1 may together constitute a resonant carrier; through the structure configuration of the cavity boundary structure BS, the structural support strength of the resonant carrier can be improved. Further, through disposing the charge accumulation preventing layer, the quality of the resonant carrier is further improved, thereby improving the performance of the bulk acoustic wave resonator and the filter formed therefrom.

Figure 1F:
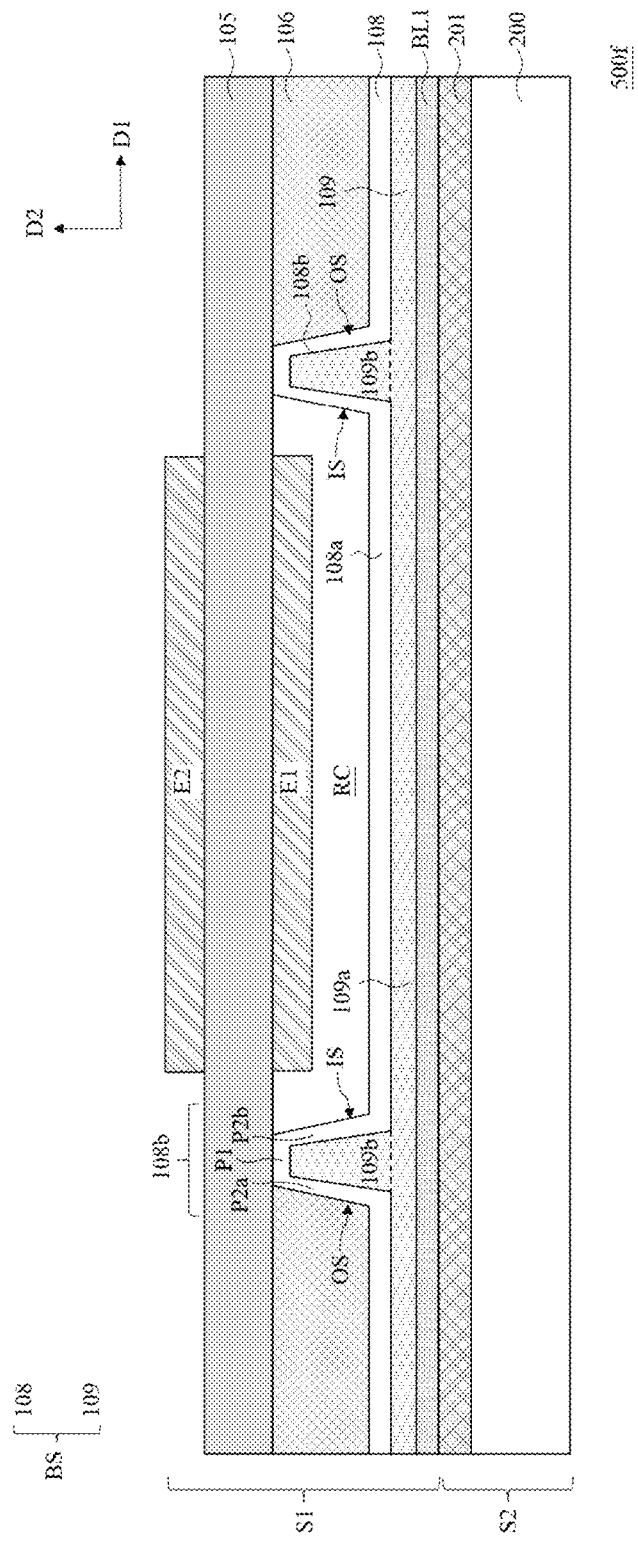

Referring to FIG. 1F, the bulk acoustic wave resonator 500f is similar to the bulk acoustic wave resonator 500c illustrated in FIG. 1C, except that the bonding layer BL2 is omitted from the sub-resonator structure S2 of the bulk acoustic wave resonator 500f. In some embodiments, the bonding layer BL1 is disposed between the cavity boundary structure BS and the barrier layer 201 of the sub-resonator structure S2, and is in contact with the barrier layer 201. The candidate materials for the barrier layer 201 and the bonding layer BL1 are similar to those described in the previous embodiments (e.g., the embodiment illustrated in FIG. 1C). In this embodiment, similar to the embodiment described with reference to FIG. 1C, the barrier layer 201 serves as the charge accumulation preventing layer, and is configured to avoid the generation of undesired conductive channel due to charge accwnulation on the surface of the carrier substrate 200. In addition, the barrier layer 201 further serves as a bonding material for bonding to the bonding layer BL1. In some embodiments, the barrier layer 201 may be a single-layer structure or a multi-layer structure, and the material of the barrier layer 201 may be selected from at least one of polysilicon, amorphous silicon, SiN, AlN, SiC, GaN, silicon oxide. For example, in the case where the barrier layer 201 is a single-layer structure, the material of the barrier layer 201 may be polysilicon or amorphous silicon, and in the case where the barrier layer 201 is a multi-layer structure, the barrier layer 201 may be a stack layer including multiple materials selected from the above-mentioned materials, and the surface layer of the barrier layer 201 in direct contact with the carrier substrate 200 does not include silicon oxide, while the material of the barrier layer 201 at the side away from the carrier substrate 200 (e.g., the surface layer at the side close to or in contact with the bonding layer BL1) may be polysilicon or amorphous silicon.

In this embodiment, the sub-resonator structure S2 including the carrier substrate 200 and the barrier layer 201, and the cavity boundary structure BS1, the periphery dielectric layer 106 and the bonding layer BL1 of the sub-resonator structure S1 together constitute the resonant carrier; through the structure configuration of the cavity boundary structure BS, the structural support strength of the resonant carrier can be improved; further, through disposing the charge accumulation prevention layer, the quality of the resonant carrier is further improved, thereby improving the performance of the bulk acoustic wave resonator and the filter formed therefrom.

Figure 1G:
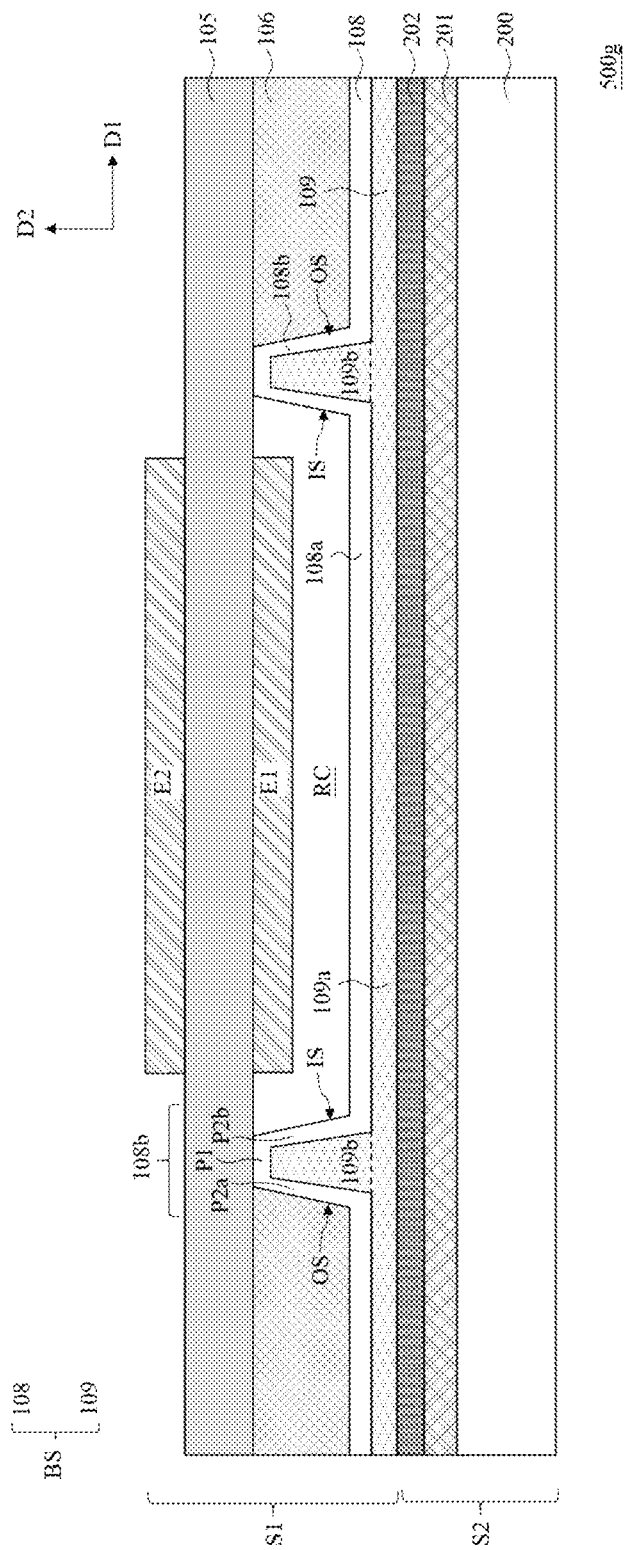

Referring to FIG. 1G, in some embodiments, the bulk acoustic wave resonator 500g is similar to the bulk acoustic wave resonator 500b illustrated in FIG. 1B, except that in the bulk acoustic wave resonator 500g, the sub-resonator structure S2 further includes a buffer layer 202. In some embodiments, the buffer layer 202 is disposed on the side of the barrier layer 201 away from the carrier substrate 200. The buffer layer 202 is disposed between the barrier layer 201 and the dielectric support layer 109 of the cavity boundary structure BS, for example. The buffer layer 202 is a non-conductive material, and may include a suitable dielectric material, such as silicon nitride (SiN), silicon oxide ($SiO_2$), aluminum nitride (AlN), the like, or combinations thereof. The buffer layer 202 may be a single-layer structure or a multi-layer structure, and in the case where the buffer layer 202 is a multi-layer structure, the buffer layer 202 may include a stack layer including a combination of two or more of the above-mentioned materials. In this embodiment, the buffer layer 202 is configured to create a bonding condition to balance the warpage of the carrier substrate 200. For example, one of the buffer layer 202 and the barrier layer 201 has tensile stress, while the other one of the buffer layer 202 and the barrier layer 201 has compressive stress, such that the warpage of the carrier substrate 200 can be balanced. For example, the buffer layer 202 has a substantially flat surface (e.g., a top surface) to facilitate the bonding of the sub-resonator structures S1 and S2. For example, since the buffer layer 202 is disposed on the barrier layer 201, and the buffer layer 202 has a substantially flat surface, it is advantage for the bonding of the buffer layer 202 and the dielectric support layer 109 of the cavity boundary structure BS. In the embodiments in which the buffer layer 202 includes silicon oxide, since the barrier layer 201 is disposed between the buffer layer 202 and the carrier substrate 200 to separate the buffer layer 202 apart from the carrier substrate 200, the carrier substrate 200 is not in direct contact with the buffer layer 200, as such, in the embodiment in which the carrier substrate 200 includes monocrystalline silicon material, there will be no contact interface between the monocrystalline silicon and silicon oxide on the surface of the carrier substrate 200, thereby avoiding the generation of undesired conductive channel due to charge accumulation at the contact interface between monocrystalline silicon and silicon oxide.

In this embodiment, the sub-resonator structure S2 including the carrier substrate 200, the barrier layer 201 and the buffer layer 202, and the cavity boundary structure BS1 and the periphery dielectric layer 106 of the sub-resonator structure S1 may together constitute the resonant carrier; through the structure configuration of the cavity boundary structure BS, the structural support strength of the resonant carrier can be improved; further, through disposing the barrier layer serving as the charge accumulation preventing layer and the buffer layer, the performance of the resonant carrier is further improved, thereby improving the performance of the bulk acoustic wave resonator and the filter formed therefrom.

Figure 1H:
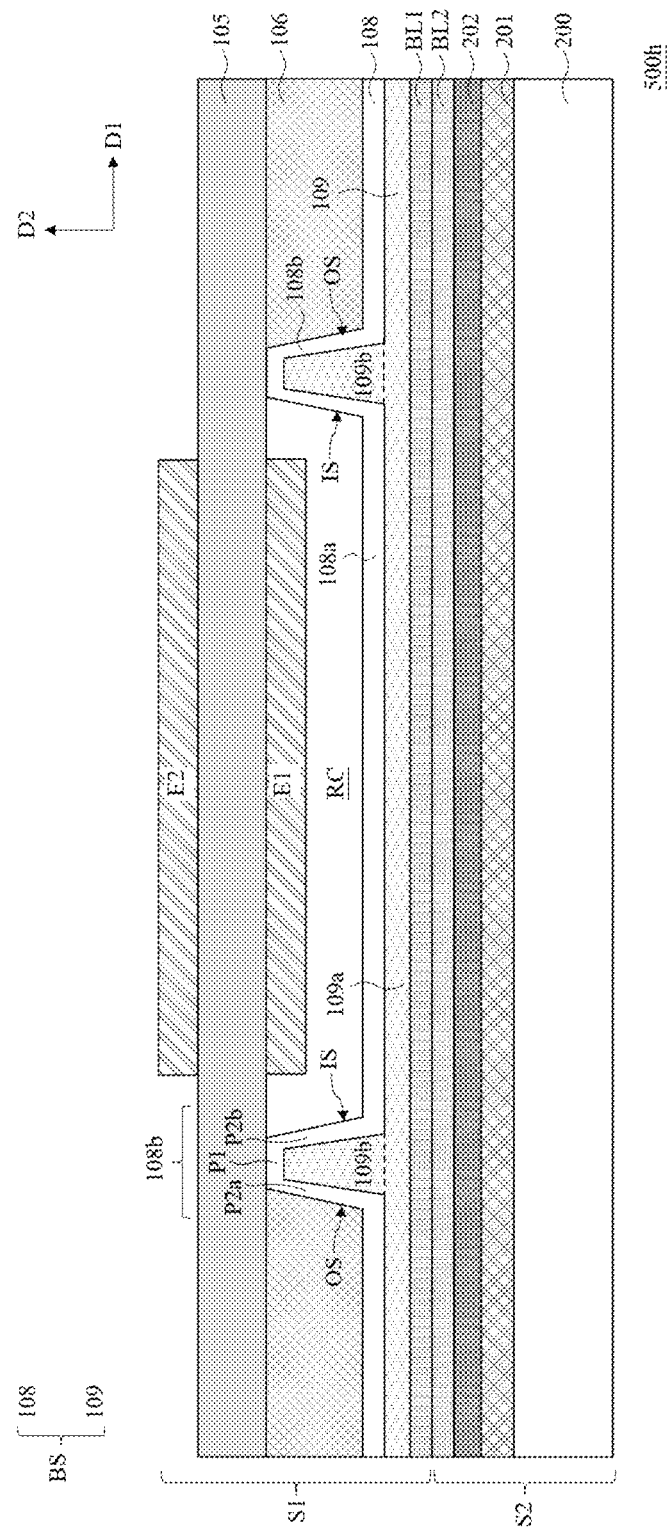
Figure 11:
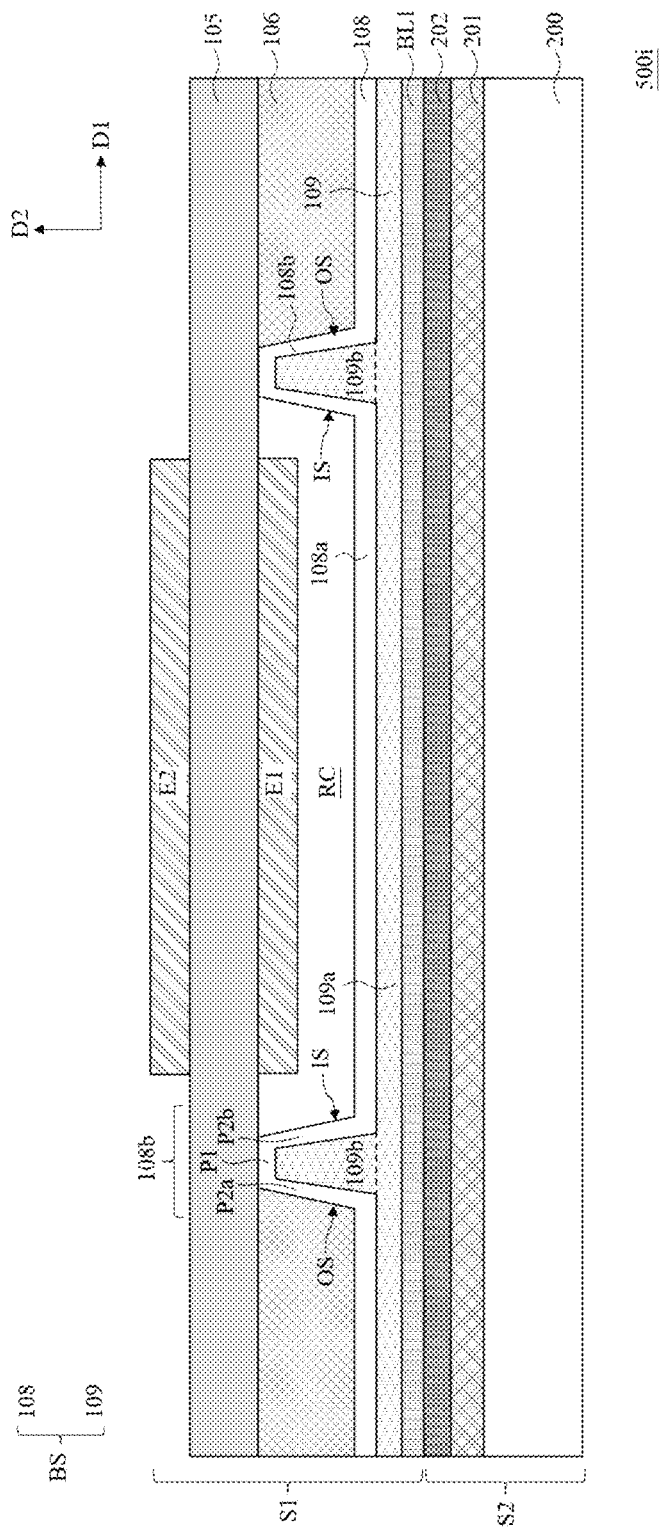

Referring to FIG. 1H, in some embodiments, a bulk acoustic wave resonator 500h is similar to the bulk acoustic wave resonator 500c illustrated in FIG. 1C, except that in the bulk acoustic wave resonator 500h, the sub-resonator structure S2 further includes a buffer layer 202, and the buffer layer 202 is disposed between the barrier layer 201 and the bonding layer BL2. In this embodiment, similar to the bulk acoustic wave resonator 500c, the barrier layer 201 may be in direct contact with the carrier substrate 200 and serve as a charge accumulation preventing layer to avoid generation of undesired conductive channel due to charge accumulation on the surface of the carrier substrate 200, thereby improving the performance of the bulk acoustic wave resonator. The buffer layer 202 is disposed on the side of the barrier layer 201 close to the bonding layer BL2. In this embodiment, the buffer layer 202 is configured to create a bonding condition, and balance the warpage of the carrier substrate 200, and, for example, have a substantially flat surface (e.g., top surface) to facilitate subsequent bonding. For example, one of the buffer layer 202 and the barrier layer 201 has tensile stress, and the other one of the buffer layer 202 and the barrier layer has compressive stress, as such, the warpage of the carrier substrate 200 can be balanced. For example, since the buffer layer 202 is disposed on the barrier layer 201, and the buffer layer 202 has a substantially flat surface, the bonding layer BL2 formed on the buffer layer 202 can also have a substantially flat surface (e.g., top surface) to facilitate the bonding of the bonding layer BL2 and the bonding layer BL1. The candidate materials for the barrier layer 201, the buffer layer 202 and the bonding layers BL1, BL2 are similar to those described in the previous embodiments. In some embodiments, the material of the barrier layer 201 may be a non-conductive and non-silicon-oxide material, for example, including at least one of polysilicon, amorphous silicon, silicon nitride, aluminum nitride, and gallium nitride; the material of the buffer layer may include at least one of silicon nitride, silicon oxide, and aluminum nitride. However, the present disclosure is not limited thereto.

In this embodiment, the sub-resonator structure S2 including the carrier substrate 200, the barrier layer 201, the buffer layer 202 and the bonding layer BL2, and the cavity boundary structure BS1, the periphery dielectric layer 106 and the bonding layer BL1 of the sub-resonator structure S1 together constitute a resonant carrier; through the structure configuration of the cavity boundary structure BS, the structural support strength of the resonant carrier can be improved; further, through disposing the barrier layer serving as the charge accumulation preventing layer, the buffer layer and the bonding layer, the performance of the resonant carrier is further improved, thereby improving the performance of the bulk acoustic wave resonator and the filter formed therefrom.

Referring to FIG. 1I, the bulk acoustic wave resonator 500i is similar to the bulk acoustic wave resonator 500g illustrated in FIG. 1G, except that in the semiconductor structure 500i, the sub-resonator structure S1 further includes a bonding layer BL1, and the bonding layer BL1 is disposed on the side of the dielectric support layer 109 of the cavity boundary structure BS close to the sub-resonator structure S2 and is in contact with the buffer layer 202. The material of the bonding layer BL1 is similar to that described in the previous embodiment, and includes, for example, amorphous silicon. In some embodiments, the material of the buffer layer 202 includes at least one of non-conductive materials such as silicon nitride, silicon oxide, aluminum nitride, polysilicon, amorphous silicon, and the like. The buffer layer 202 may be a single-layer structure or a multi-layer structure. For example, in the case where the buffer layer 202 is a single-layer structure, the material of the buffer layer 202 may be polysilicon or amorphous silicon; in the case where the buffer layer 202 is a multi-layer structure, the material of the outermost surface layer of the buffer layer 202 at the side away from the carrier substrate 200 and the barrier layer 201 (e.g., the surface layer at the side close to or in contact with the bonding layer BL1) may be polysilicon or amorphous silicon, but the present disclosure is not limited thereto. In this embodiment, similar to the bulk acoustic wave resonator 500g, the barrier layer 201 is in direct contact with the carrier substrate 200, and serves as the charge accumulation preventing layer to avoid the generation of undesired conductive channel due to charge accumulation on the surface of the carrier substrate 200, thereby improving the performance of the bulk acoustic wave resonator.

In this embodiment, the sub-resonator structure S2 including the carrier substrate 200, the barrier layer 201, the buffer layer 202, and the cavity boundary structure BS1, the periphery dielectric layer 106 and the bonding layer BL1 of the sub-resonator structure S1 together constitute the resonant carrier; through the structure configuration of the cavity boundary structure BS, the structural support strength of the resonant carrier can be improved; further, through disposing the barrier layer serving as the charge accumulation preventing layer, the buffer layer and the bonding layer, the performance of the resonant carrier is further improved, thereby improving the performance of the bulk acoustic wave resonator and the filter formed therefrom.

FIG. 2A to FIG. 2K are schematic cross-sectional views illustrating various stages in a method of forming a bulk acoustic wave resonator according to some embodiments of the present disclosure. The forming method is briefly described below taking the bulk acoustic wave resonator 500a as an example.

Figure 2A:
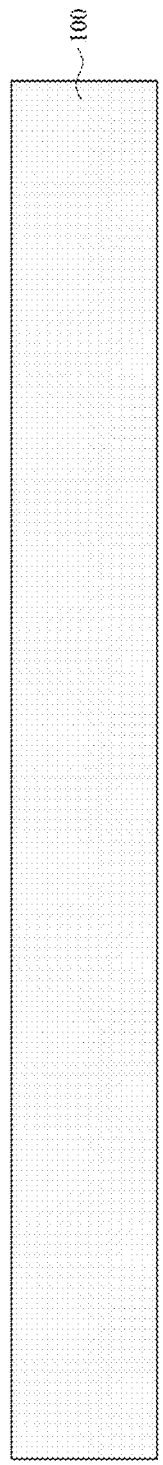

Referring to FIG. 2A, a substrate 100 is provided. The substrate 100 may be a semiconductor substrate, such as a silicon substrate, but the present disclosure is not limited thereto. The substrate 100 may also adopt other suitable materials as long as it can provide structural support for the subsequently formed overlying layers. The substrate 100 will be removed from the bulk acoustic wave resonator in a subsequent process, and may also be referred to as a sacrificial substrate.

Figure 2B:
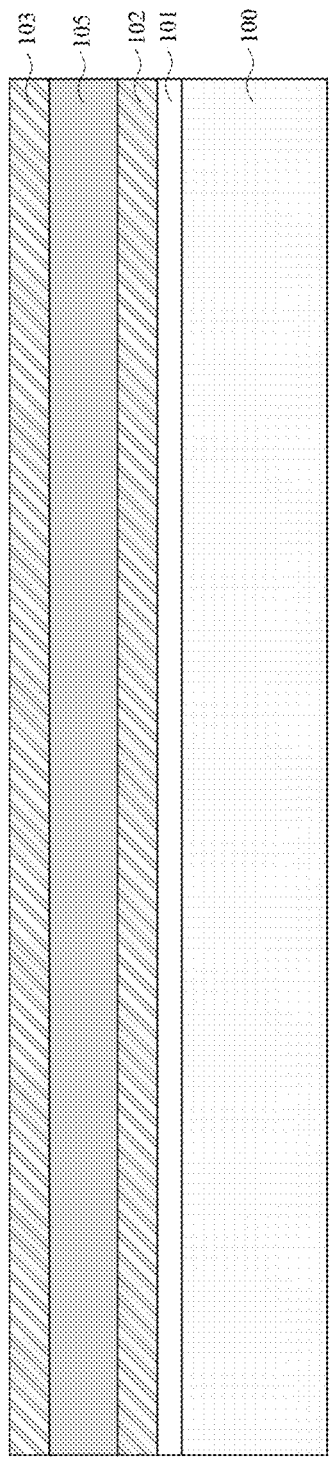

Referring to FIG. 2B, in some embodiments, a dielectric layer 101 is formed on the substrate 100. The dielectric layer 101 may be an oxide layer, such as including silicon oxide ($SiO_2$). The dielectric layer 101 may be formed by a deposition process such as chemical vapor deposition or a thermal oxidation process. Thereafter, an electrode material layer 102, a piezoelectric layer 105 and an electrode material layer 103 are sequentially formed on the dielectric layer 101. The electrode material layer 102 and the electrode material layer 103 are respectively used to form the above-described electrode E2 and electrode E1, and their respective materials may refer to the materials described above with reference to FIG. 1A, which are not described again here. The electrode material layer 102, the piezoelectric layer 105, and the electrode material layer 103 may be formed using suitable deposition methods, respectively. For example, the electrode material layers 102 and 103 may be formed by physical vapor deposition processes, and the piezoelectric layer 105 may be formed by a chemical vapor deposition process.

Figure 2C:
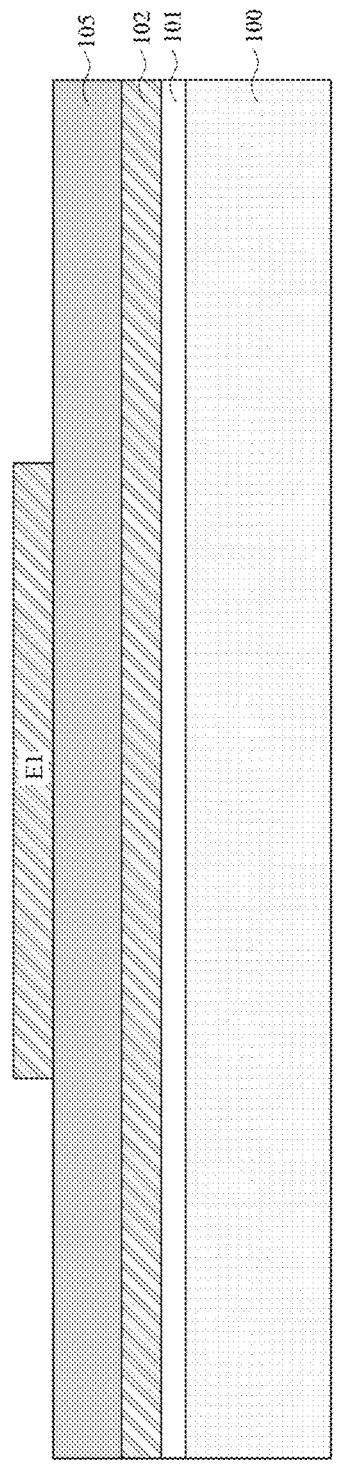

Referring to FIG. 2C, a patterning process is performed on the electrode material layer 103 to form the electrode E1. For example, the electrode material layer 103 may be patterned through photolithography and etching processes to remove a portion of the electrode material layer 103 and form the electrode E1.

Figure 2D:
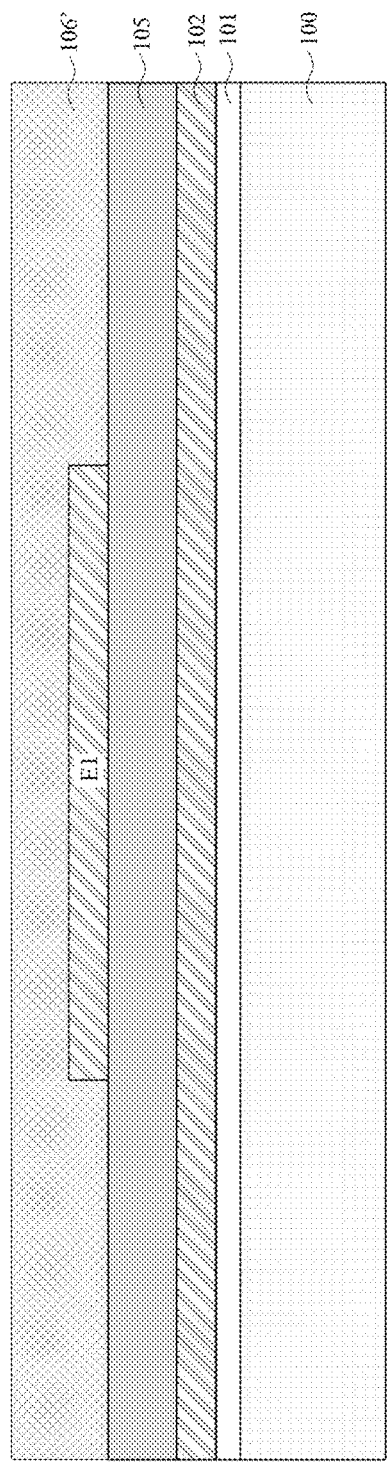

Referring to FIG. 2D, a dielectric layer 106' is formed on the piezoelectric layer 105. In some embodiments, the dielectric layer 106' is formed on a side of the piezoelectric layer 105 away from the electrode material layer 102, so as to cover the surface of the piezoelectric layer 105 at the side away from the electrode material layer 102, the sidewalls of the electrode E1 and the surface of the electrode E1 at the side away from the piezoelectric layer 105. The dielectric layer 106' may include, for example, a suitable dielectric material such as silicon oxide, and may be formed by a deposition process such as CVD, a spin method, or the like. In some embodiments, the dielectric layer 106' has a substantially flat surface. For example, after the dielectric material is deposited, a planarization process (e.g., a chemical mechanical polishing process (CMP)) may be performed on the dielectric material, such that the dielectric layer 106' has a substantially flat surface.

Figure 2E:
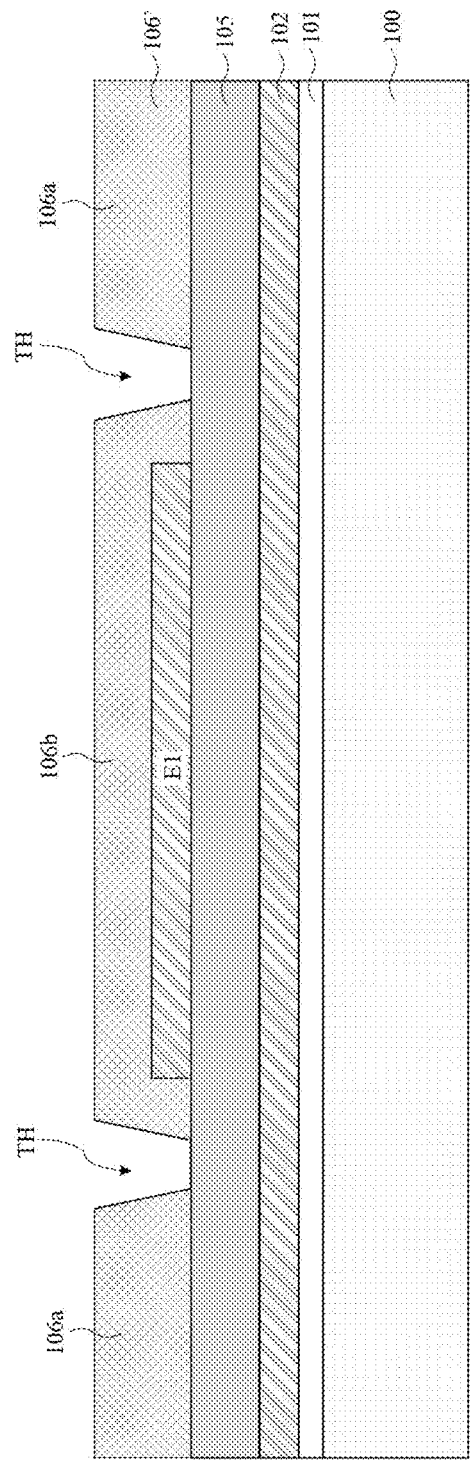
Figure 3A:
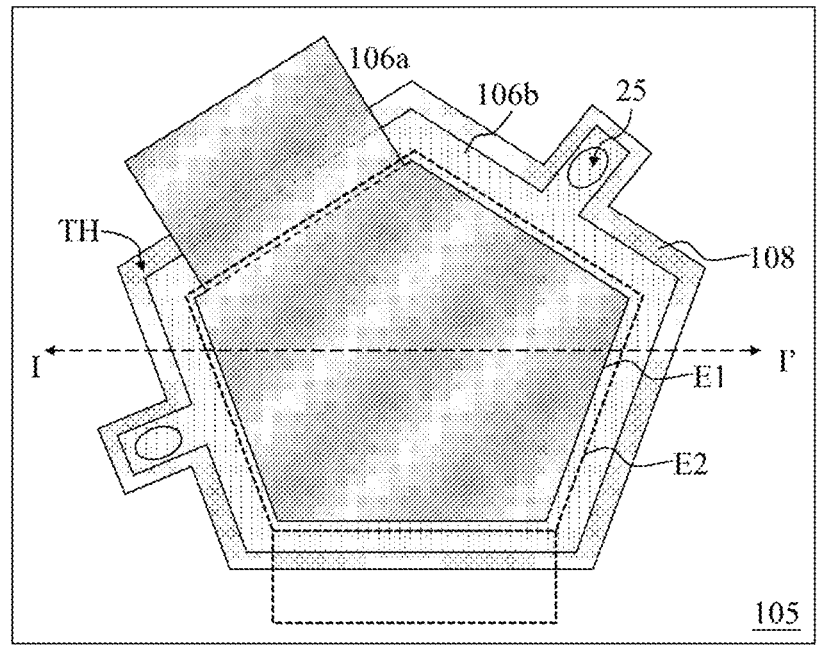
FIG. 3A and FIG. 3B are schematic plan views illustrating a bulk acoustic wave resonator according to some embodiments of the present disclosure.

Referring to FIG. 2D to FIG. 2E, a patterning process (e.g., including photolithography and etching processes) is performed on the dielectric layer 106' to remove a portion of the dielectric layer 106' and form a trench TH in the dielectric layer 106'. In some embodiments, the trench TH exposes a portion of the surface of the piezoelectric layer 105 at the side away from the electrode material layer 102. That is to say, the trench TH is defined by the sidewalls of the dielectric layer 106' and a portion of the surface of the piezoelectric layer 105 at the side away from the electrode material layer 102. The cross-sectional shape of the trench TH may be trapezoid, square, rectangle or the like. In some embodiments, when viewed in a plan view, for example, as shown in FIG. 3A, the trench TH is ring-shaped, such as an irregular ring-shaped structure or other types of ring-shaped structures. The trench TH may be a closed ring-shaped structure, and divide the dielectric layer 106' into a periphery dielectric part 106a and a sacrificial dielectric part 106b that are spaced apart from each other. In other words, the periphery dielectric part 106a continuously extends over the edge of the piezoelectric layer 105 and laterally surrounds the sacrificial dielectric part 106b, and is spaced apart from the sacrificial dielectric part 106b by the trench TH.

Figure 2F:
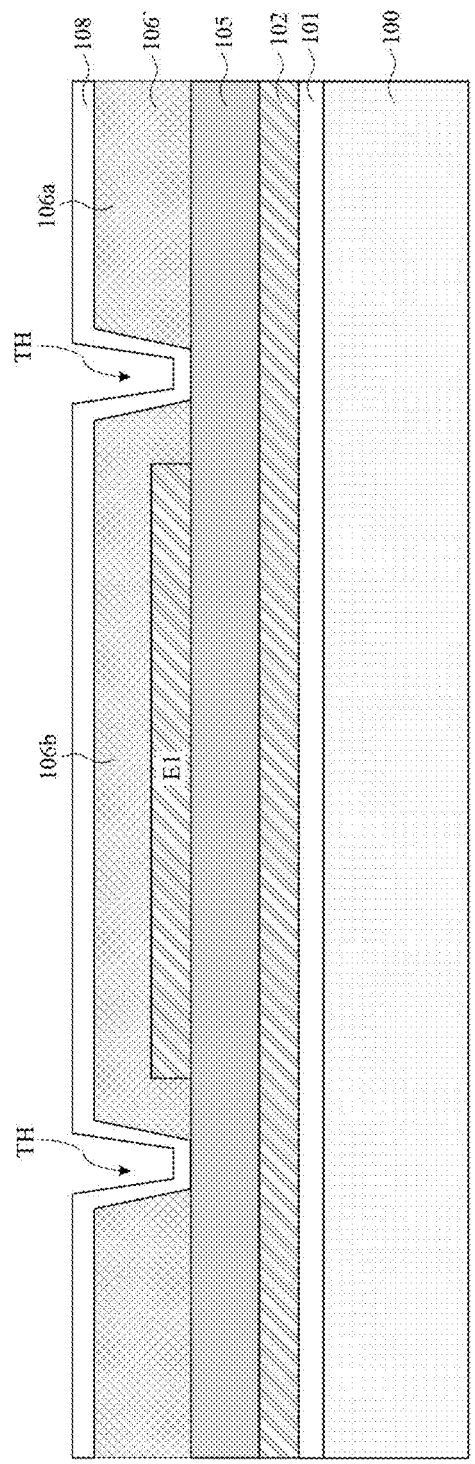

Referring to FIG. 2F, a boundary layer 108 is formed over the piezoelectric layer 105 to cover the surface of the dielectric layer 106' at the side away from the piezoelectric layer 105, and the boundary layer 108 is filled in the trench TH to cover the sidewalls of the dielectric layer 106' and the portion of the surface of the piezoelectric layer 105 defining the trench TH. The material of the boundary layer 108 is different from the material of the dielectric layer 106'. The boundary layer 108 and the dielectric layer 106' are, for example, materials having different etching selectivity ratios relative to the etchant of the subsequent etching process. For example, the dielectric layer 106 includes a material that is easily etched by hydrofluoric acid, while the material of the boundary layer 108 is a material that is not etched by hydrofluoric acid. In some embodiments, the material of boundary layer 108 may include a semiconductor material, a dielectric material, the like, or combinations thereof. For example, the boundary layer 108 may include amorphous Si, polysilicon, silicon nitride, tantalum nitride, gallium nitride, aluminum nitride, the like, or combinations thereof. The boundary layer 108 may be formed by a suitable deposition process such as CVD, atomic layer deposition (ALD).

In some embodiments, the boundary layer 108 partially fills into the trench TH and lines the surface of trench TH, for example. The boundary layer 108 extends along the surface of the dielectric layer 106' at the side away from the electrode material layer 102 and along the surface of the trench TH. The boundary layer 108 is, for example, a conformal layer, that is, the boundary layer 108 has a substantially uniform thickness in the region along which the boundary layer extends, but the present disclosure is not limited thereto. The boundary layer 108 covers the surface of the dielectric layer 106' at the side away from the electrode material layer 102 and the sidewalls of the dielectric layer 106' that define the trench TH, and is in contact with a portion of the surface of the piezoelectric layer 105 at the bottom of the trench TH. In other words, the boundary layer 108 covers the surface of the periphery dielectric part 106a at the side away from the piezoelectric layer 105 and the sidewall of the periphery dielectric part 106a, and surrounds to cover the surface of the sacrificial dielectric part 106b at the side away from the piezoelectric layer 105 and the sidewall of the sacrificial dielectric part 106b. In this way, the sacrificial dielectric part 106b is located in a space (e.g., a closed space) surrounded by the boundary layer 108, a portion of the surface of the piezoelectric layer 105 at the side away from the electrode material layer 102, and the surface of the electrode E1, and is enclosed by these layers.

Figure 2G:
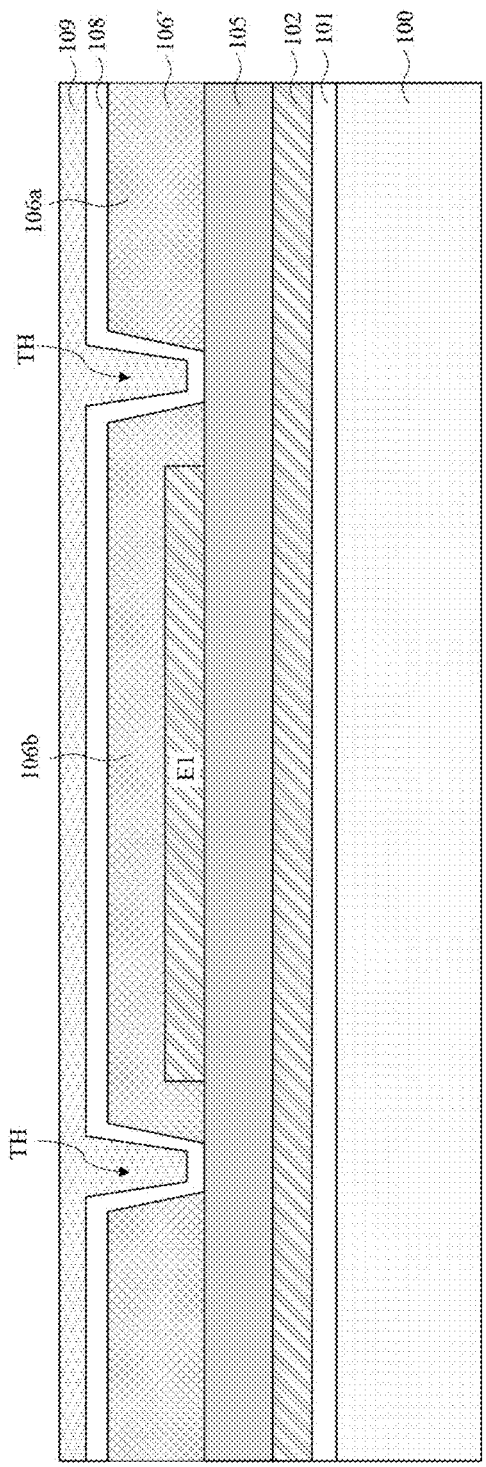

Referring to FIG. 2G, a dielectric support layer 109 is formed on the boundary layer 108 to cover the surface of the boundary layer 108 at the side away from the piezoelectric layer 105 and fill into the trench TH. In some embodiments, the dielectric support layer 109 substantially fills up the trench TH, and the top surface of the dielectric support layer 109 is higher than the topmost surface of the boundary layer 108. In some embodiments, the dielectric support layer 109 completely covers the surface of the boundary layer 108 at the side away from the piezoelectric layer 105. The material of the dielectric support layer 109 may be different from the material of the boundary layer 108, and may be the same as or different from the material of the dielectric layer 106', for example, the dielectric support layer 109 includes a dielectric material such as silicon oxide ($SiO_2$). The forming method of the dielectric support layer 109 may include depositing a dielectric material layer and then performing a planarization process (e.g., CMP) on the dielectric material layer. In some embodiments, the dielectric support layer 109 has a substantially flat top surface (i.e., the surface at the side away from the piezoelectric layer 105), and the top surface of the dielectric support layer 109 is substantially parallel to the top surface of the piezoelectric layer 105. It should be noted that, the top surface described here refers to the top surfaces illustrated in FIG. 2G, while in other steps, for example, after the structure is turned over, the top surfaces may be bottom surfaces.

Figure 2H:
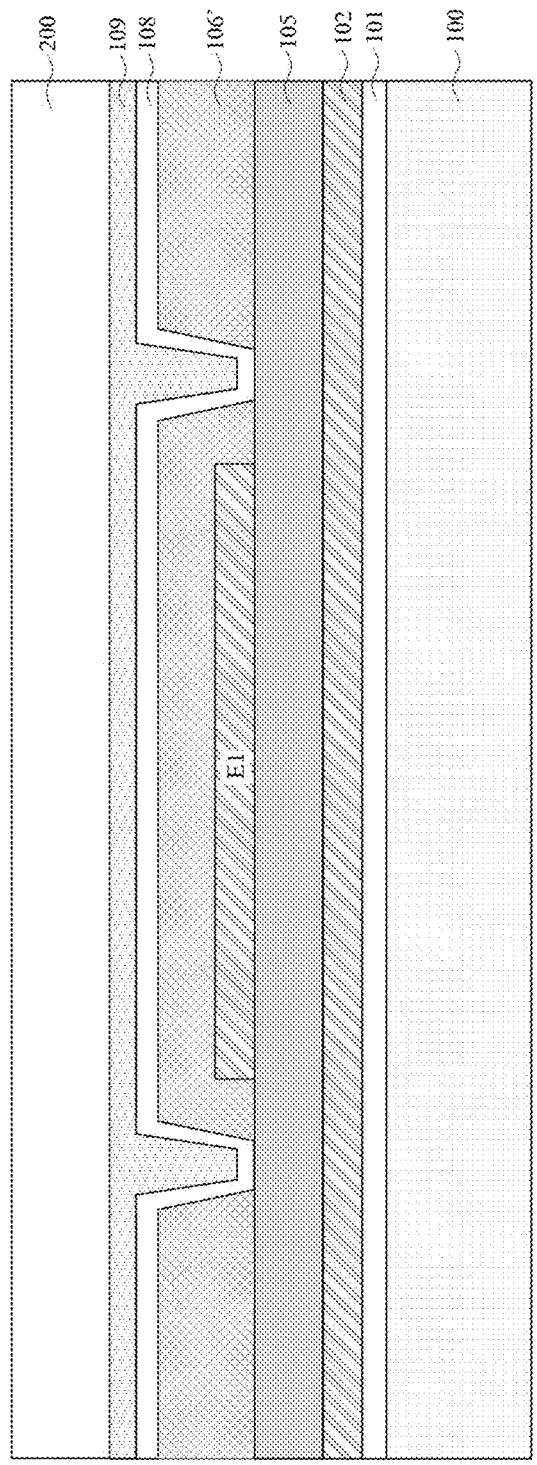
Figure 21:
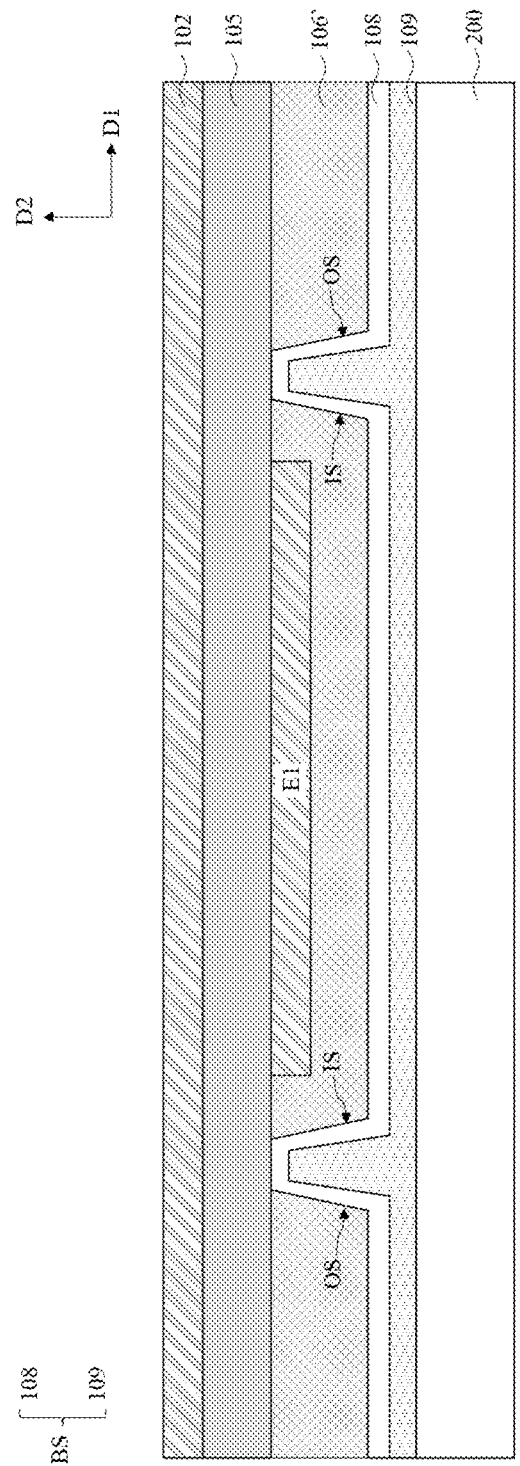

Referring to FIG. 2H, a carrier substrate 200 is provided, and the carrier substrate 200 is bonded to the dielectric support layer 109. The material of the carrier substrate 200 is similar to that described above with reference to FIG. 1A and is not described again here. The bonding of the carrier substrate 200 to the dielectric support layer 109 may be accomplished by any suitable bonding process, such as fusion bonding, vacuum bonding, etc., and the present disclosure is not limited thereto, as long as the carrier substrate 200 and the dielectric support layer 109 can be effectively bonded together.

Referring to FIG. 2H and FIG. 2I, the substrate 100 and the dielectric layer 101 are removed. For example, the structure of FIG. 2H is turned over, and the substrate 100 and the dielectric layer 101 are then removed by, for example, a grinding process (e.g., CMP) and/or an etching process, and the surface of the electrode material layer 102 at the side away from the piezoelectric layer 105 is exposed.

Figure 2J:
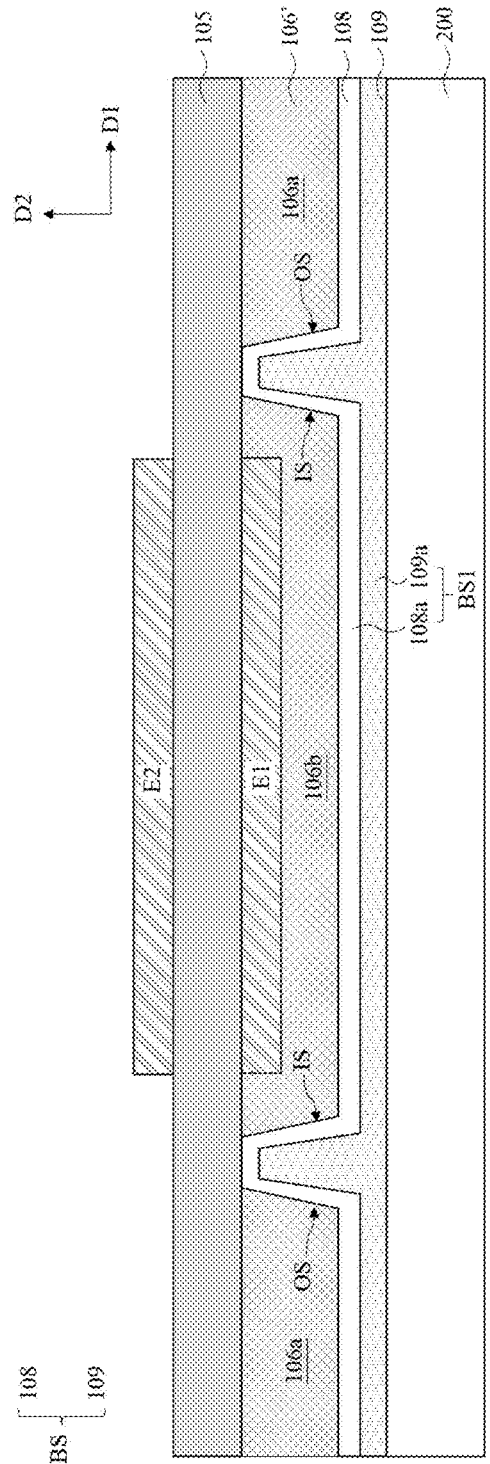

Referring to FIG. 2I and FIG. 2J, a patterning process is performed on the electrode material layer 102 to remove a portion of the electrode material layer 102 and form an electrode E2. The patterning process may include, for example, photolithography and etching processes. Thereafter, as illustrated in FIG. 2J to FIG. 2K, the sacrificial dielectric part 106b is removed to from the cavity RC, and the periphery dielectric part 106a is remained to serve as the periphery dielectric layer 106.

Figure 2K:
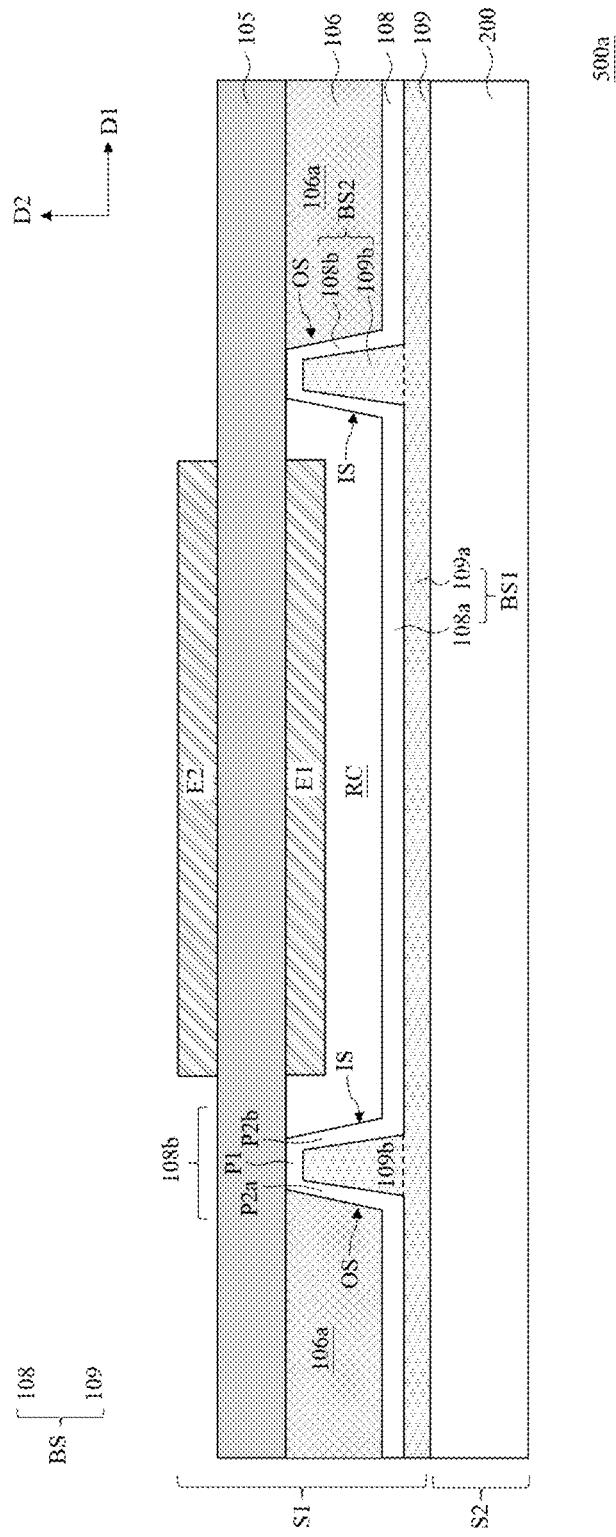
Figure 3B:
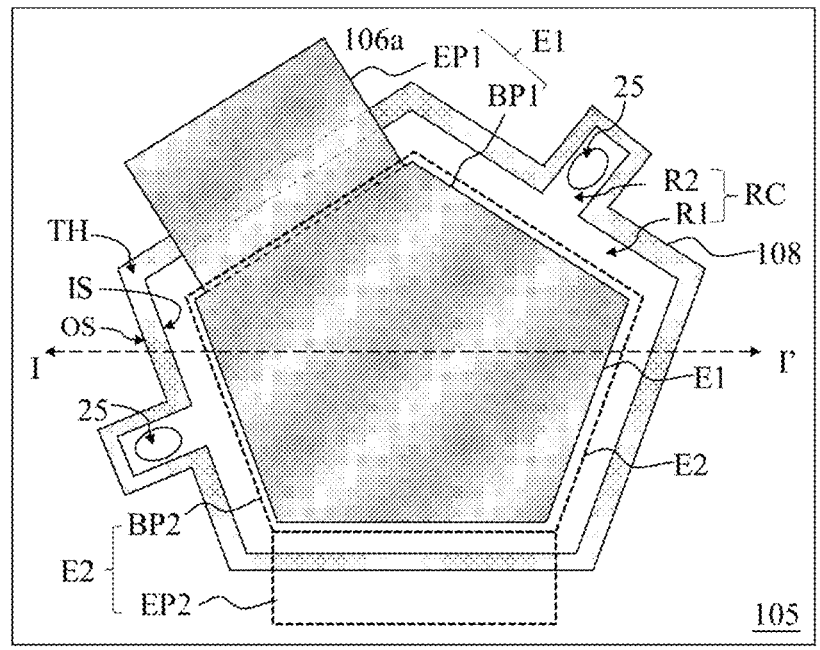

FIG. 3A and FIG. 3B respectively illustrate schematic plan views of FIG. 2J and FIG. 2K according to some embodiments of the disclosure, and FIG. 2J and FIG. 2K are cross-sections views taken along lines I-I' of FIG. 3A and FIG. 3B, respectively.

Referring to FIG. 2J to FIG. 2K and FIG. 3A and FIG. 3B, in some embodiments, the removal of the sacrificial dielectric part 106b may include an etching process; for example, a patterning process may be performed on the piezoelectric layer 105 to form the release holes 25 (FIG. 3A); for example, the patterning process includes performing an etching process on the piezoelectric layer 105 using a patterned mask layer as an etching mask, so as to remove portions of the piezoelectric layer 105, and form release holes 25 extending through the piezoelectric layer 105 and exposing portions of the surface of the sacrificial dielectric part 106b. The etchant for etching the sacrificial dielectric part 106b may enter the region where the sacrificial dielectric part 106b is located from the release holes 25, so as to remove the sacrificial dielectric part 106b, and form a cavity RC at the region previously occupied by the sacrificial dielectric part 106b. In the plan view FIG. 3A, the shape of the release hole 25 is, for example, oval, circular, or any other suitable shape. It should be understood that the abovementioned shapes of the release holes are merely for illustration, and the present disclosure is not limited thereto. In some embodiments, a single release hole or a plurality of release holes 25 may be formed in piezoelectric layer 105, and the number of release hole(s) 25 is not limited in the present disclosure.

In some embodiments, the etch process has a high etch selectivity ratio of the sacrificial dielectric part 106b to the boundary layer 108 of the boundary structure BS, that is, the etch process removes the sacrificial dielectric part 106b, and substantially does not remove the boundary layer 108, and the piezoelectric layer 105 is also substantially not corroded by the etching process. The boundary layer 108 serves as an etch stop layer during the etch process for defining the cavity RC. For example, the etching process uses hydrofluoric acid as an etchant to remove the sacrificial dielectric part 106b, while the boundary layer 108 is formed from a material that is substantially not corroded by hydrofluoric acid, and the boundary layer 108 is substantially not removed or corroded by the etching process. In the embodiments of the present disclosure, since the cavity boundary structure BS adopts a bilayer structure including the boundary layer 108 and the dielectric support layer 109, the boundary layer 108 is located at the side close to the cavity and is directly used to define the cavity RC, the material of the boundary layer 108 needs to choose a material that is not etched by the etching process, while the dielectric support layer 109 of the cavity boundary structure BS is located on the side of the boundary layer 108 away from the cavity RC, and the boundary layer 108 separates the etchant apart from the dielectric support layer 109 during the etching process, therefore, the dielectric support layer 109 would not contact the etchant and is thus not corroded by the etching process; as such, the choice of materials for the dielectric support layer 109 is relatively free, which is not necessary to consider the impact of the etching process. For example, the dielectric support layer 109 may be selected from any non-conductive materials, so that a suitable material can be selected based on the material property of the material layer (e.g., the carrier substrate 200) of the sub-resonator structure S2 bonded thereto, such that the dielectric support layer 109 and the sub-resonator structure S2 can be effectively bonded to each other; on the other hand, since the material choice of the dielectric support layer 109 does not take into account the influence of the etching process, the carrier substrate 200 can also choose a suitable substrate material based on the material property of the dielectric support layer 109, so that the material choices of the carrier substrate 200 have more possibilities. That is to say, the material choices of the carrier substrate 200 and the dielectric support layer 109 need to consider whether the materials are suitable for the bonding, and are not necessary to consider the etch selectivity ratio of the material of the dielectric support layer 109 relative to the etching process.

Therefore, in the embodiments of the present disclosure, the cavity boundary structure BS is configured as a bilayer structure, which can not only improve the support strength of the cavity boundary structure, but also make the materials of the boundary layer and the dielectric layer in the bilayer structure can respectively select suitable materials according to the etching selectivity ratio required by the cavity etching process and the bonding process of bonding to the sub-resonator structure S2 (e.g., the carrier substrate), rather than being limited to the materials satisfying both the requirements for the etching process and the bonding process. In this way, the choices for the materials have more possibilities, and more suitable materials can also be selected to meet the respective requirements of the two processes.

After the etching process, the periphery dielectric layer 106 merely includes the periphery dielectric part 106a and is spaced apart from the cavity RC. As such, the bulk acoustic wave resonator 500a including the sub-resonator structure S1 and the sub-resonator structure S2 is thus formed.

Referring to FIG. 2K and FIG. 3B, in some embodiments, the first electrode E1 has a portion (e.g., the body part BP1) located in the cavity RC, and has a portion (e.g., the extending part EP1) extending into the periphery dielectric part 106a; the body part BP1 and the extending part EP1 are connected to each other, the extending part EP1 may be partially located in the cavity RC and extend from the cavity RC into the periphery dielectric part 106a. At least a portion (e.g., body part BP2) of the second electrode E2, the body part EP1 of the first electrode E1 and the cavity RC are overlapped with each other in a direction perpendicular to the main surface of the piezoelectric layer 105 or the carrier substrate 200, and another portion of the second electrode E2 (e.g., the extending part EP2) does not overlap with the first electrode E1 in the direction perpendicular to the piezoelectric layer 105 or the carrier substrate 200; the extending part EP2 may be partially overlapped with or may be not overlapped with the cavity RC. Referring to FIG. 3B, for example, in some embodiments, the body part BP1 of the first electrode E1 and the body part BP2 of the second electrode E2 are overlapped with each other, and the extending part EP1 of the first electrode E1 and the extending part EP2 of the second electrode E2 respectively extend and protrude from their respective body parts BP1/BP2 and toward different horizontal directions. The body part BP1 of the first electrode E1 is, for example, in a shape of pentagon, and the extending part EP1 of the first electrode E1 is, for example, in a shape of rectangle; the body part BP2 of the second electrode E2 is, for example, in a shape of pentagon, and the extending part EP2 of the second electrode E2 is, for example, in a shape of rectangle, but the present disclosure is not limited thereto, and the first electrode E1 and the second electrode E2 may have any suitable shapes.

It should be noted that, in FIG. 3B, dotted lines are respectively illustrated between the respective body parts and the extending parts of the first electrode E1 and the second electrode E2 to separate the body parts and the extending parts, it should be understood that, this dotted line is only used to illustrate the body part and the extending part of the electrode more clearly, and does not intend to limit that there has an obvious interface between the body part and the extending part of the electrode. In some embodiments, the first electrode E1 and the second electrode E2 are each a continuous layer and do not have obvious interfaces between their respective body parts and extending parts. In addition, for the clarity of the drawings, in FIG. 3B, the edges of the body parts of the first electrode E1 and the second electrode E2 are illustrated as being not aligned, but the embodiments of the present disclosure is not limited thereto. In some embodiments, for example, as illustrated in FIG. 2K, the edges of the body parts of the first electrode E1 and the second electrode E2 are aligned with each other in a direction perpendicular to the main surface of the piezoelectric layer 105 or the carrier substrate 200.

In some embodiments, as illustrated FIG. 3B, the cavity RC includes, for example, a body cavity part R1 and protruding cavity parts R2 laterally protruding from the body cavity part R1 in the horizontal direction. For example, in the plan view, the body cavity part R1 is, for example, in a shape of pentagon, and the protruding cavity parts R2 protrude from side edges of the body cavity part R1, and are, for example, in shapes of rectangle. However, the above-mentioned shape of the cavity RC is merely for illustration, and the present disclosure is not limited thereto. In some other embodiments, the cavity RC may be disposed to have any suitable shape according to product requirement.

Referring to FIG. 2K and FIG. 3B, in some embodiments, the piezoelectric layer 105 has release holes 25. The release holes 25 extend through the piezoelectric layer 105 and are in spatial communication with the cavity 30. The release holes 25 are, for example, located above the protruding cavity parts R2 of the cavity 30 and are overlapped with the protruding cavity parts R2 in a direction D2 perpendicular to the main surface of the carrier substrate 200.

FIG. 4A to FIG. 4H briefly illustrate the bonding patterns between the respective sub-resonator structures in the bulk acoustic wave resonators 500b-500i (e.g., in a bonding process similar to that of FIG. 2H).

Figure 4A:
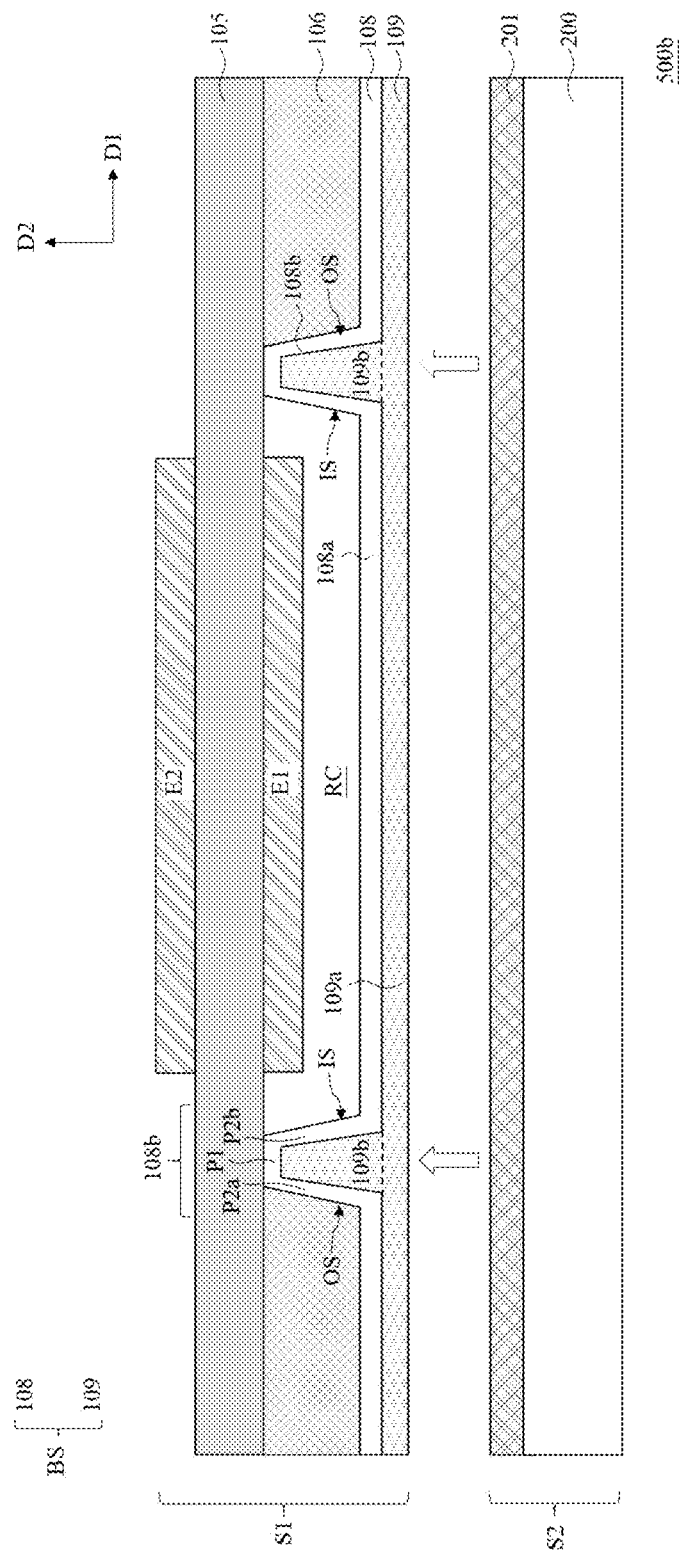
FIG. 4A to FIG. 4H illustrate bonding manners between the respective sub-resonator structures in bulk acoustic wave resonators according to some embodiments of the present disclosure.

Referring to FIG. 4A, in the bulk acoustic wave resonator 500b, the sub-resonator structure S1 includes the piezoelectric layer 105, the electrodes E1 and E2 formed on opposite sides of the piezoelectric layer 105, the cavity boundary structure BS and the dielectric layer 106 formed on the side of the piezoelectric layer 105 close to the sub-resonator structure S2, the cavity RC is located in the sub-resonator structure S1, and is defined by the cavity boundary structure BS and the piezoelectric layer 105; the sub-resonator structure S2 includes the carrier substrate 200 and the barrier layer 201 formed on the carrier substrate 200. The sub-resonator structure S1 and the sub-resonator structure S2 are bonded together through the bonding of the dielectric support layer 109 of the cavity boundary structure BS and the barrier layer 201 to each other. In some embodiments, the barrier layer 201 is deposited on the carrier substrate 200 (e.g., on the surface of the carrier substrate 200 at the side close to the sub-resonator structure S1) by a physical vapor deposition process under vacuum. Before depositing the barrier layer 201, a cleaning process (e.g., including an etching process) is performed on the carrier substrate 200 to remove (e.g., completely remove) the native oxide layer (e.g., native silicon oxide) that may exist on the surface of the carrier substrate 200, so as to ensure that there is no contact interface between monocrystalline silicon and silicon oxide on the surface of the carder substrate 200, thereby avoiding the generation of undesired conductive channel due to charge accumulation on the surface of the carrier substrate 200. The barrier layer 201 and the dielectric support layer 109 may be bonded through any suitable bonding process. In some embodiments, before the bonding process, the dielectric support layer 109 and the barrier layer 201 are kept from being exposed to air, thereafter, the dielectric support layer 109 and the barrier layer 201 are bonded and attached together under vacuum, such that the sub-resonator structure S1 and the sub-resonator structure S2 are bonded together.

Figure 4B:
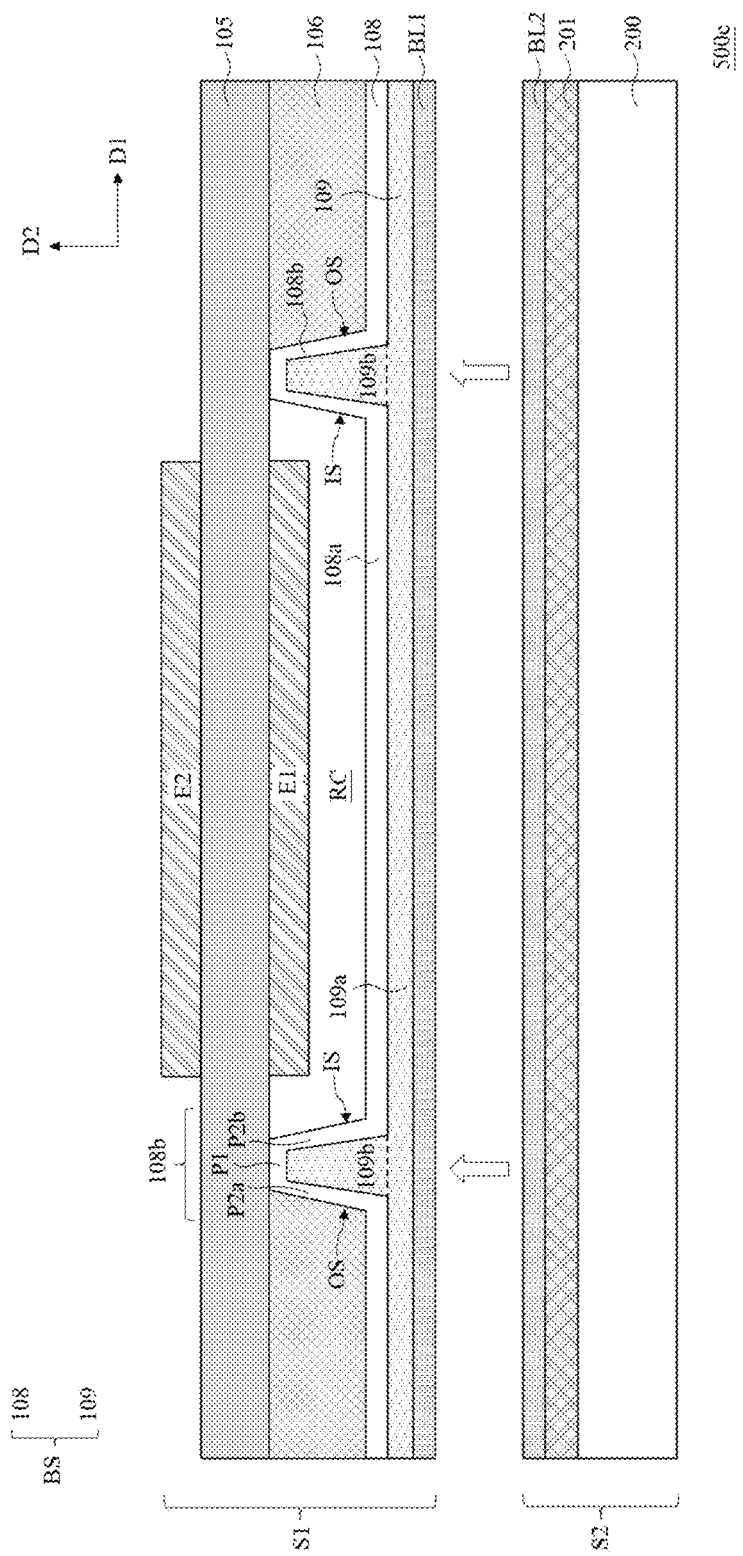

Referring to FIG. 4B, in the bulk acoustic wave resonator 500c, the sub-resonator structure S1 includes the piezoelectric layer 105, the electrodes E1 and E2 formed on opposite sides of the piezoelectric layer 105, the periphery dielectric layer 106, the cavity boundary structure BS, and the bonding layer BL1 formed on the side of the cavity boundary structure BS away from the piezoelectric layer 105 and close to the sub-resonator structure S2; the sub-resonator structure S2 includes the carrier substrate 200, and the barrier layer 201 and the bonding layer BL2 sequentially formed on the carrier substrate 200. The sub-resonator structure S1 and the sub-resonator structure S2 are bonded together through bonding the bonding layer BL1 and the bonding layer BL2 to each other. In some embodiments, the bonding layer BL1 is deposited on the dielectric support layer 109 of the cavity boundary structure BS by, for example, a physical vapor deposition process (e.g., sputtering) under vacuum, and the bonding layer BL2 is deposited on the barrier layer 201 (e.g., on the surface of the barrier layer 201 at the side away from the carrier substrate 200) by a physical vapor deposition process under vacuum. Before the bonding process, the bonding layer BL1 and the bonding layer BL2 are kept from being exposed to the air, thereafter, the bonding layer BL1 and the bonding layer BL2 are bonded and attached together under vacuum, such that the sub-resonator structure S1 and the sub-resonator structure S2 are bonded together.

Figure 4C:
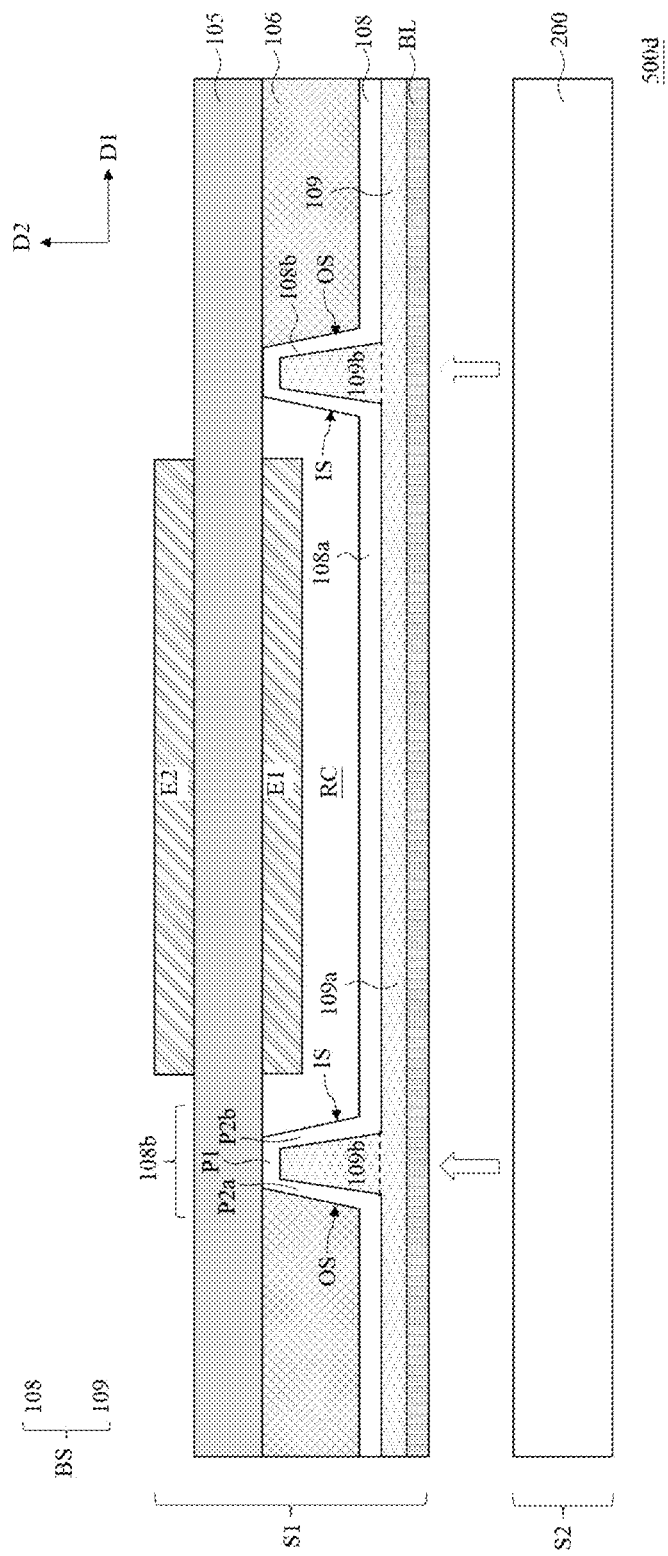

Referring to FIG. 4C, in the bulk acoustic wave resonator 500d, the sub-resonator structure S1 includes the piezoelectric layer 105, the electrodes E1 and E2 formed on opposite sides of the piezoelectric layer 105, the periphery dielectric layer 106, the cavity boundary structure BS and the bonding layer BL; the sub-resonator structure S2 includes the carrier substrate 200. The sub-resonator structure S1 and the sub-resonator structure S2 are bonded together through bonding and attaching the bonding layer BL and the carrier substrate 200 to each other. In some embodiments, the bonding layer BL is deposited on the dielectric support layer 109 of the cavity boundary structure BS by a physical vapor deposition process under vacuum. In addition, before the bonding process, the native oxide layer (e.g., silicon oxide layer) on the surface of the carder substrate 200 is completely removed, such that there is free of silicon oxide existed on the surface of the carrier substrate 200 or between the carrier substrate 200 and the bonding layer BL subsequent bonded thereto. Before the bonding process, the bonding layer BL and the carrier substrate 200 are kept from being exposed to the air, thereafter, the bonding layer BL and the carrier substrate 200 are bonded and attached together under vacuum, such that the sub-resonator structure S1 and the sub-resonator structure S2 are bonded together.

Figure 4D:
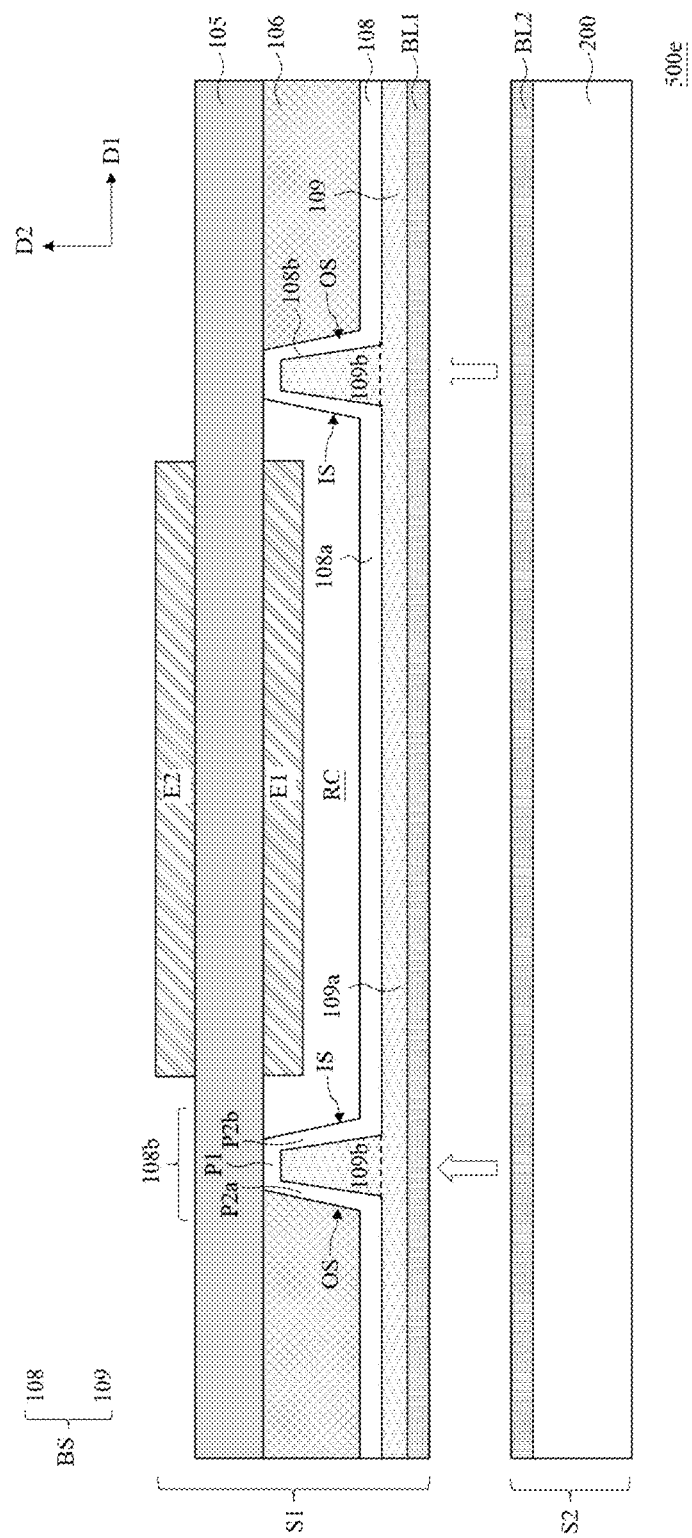

Referring to FIG. 4D, in the bulk acoustic wave resonator 500e, the sub-resonator structure S1 includes the piezoelectric layer 105, the electrodes E1 and E2 formed on opposite sides of the piezoelectric layer 105, the periphery dielectric layer 106, the cavity boundary structure BS, and the bonding layer BL1 formed on the side of the cavity boundary structure BS away from the piezoelectric layer 105; the sub-resonator structure S2 includes the carrier substrate 200 and the bonding layer BL2 formed on the carder substrate 200. The sub-resonator structure S1 and the sub-resonator structure S2 are bonded together through bonding the bonding layer BL1 and the bonding layer BL2 to each other. In some embodiments, the bonding layer BL1 is deposited on the dielectric support layer 109 of the cavity boundary structure BS by a physical vapor deposition process (e.g., sputtering) under vacuum, and the bonding layer BL2 is deposited on the carrier substrate 200 (e.g., on the surface of the carrier substrate 200 at the side close to the sub-resonator structure S1) by a physical vapor deposition process (e.g., sputtering) under vacuum. Before depositing the bonding layer BL2, the native oxide layer on the surface of the carrier substrate 200 is completely removed, such that no electron-rich material such as oxide layer (e.g., silicon oxide layer) is existed on the surface of the carrier substrate 200 or between the carrier substrate 200 and the subsequently formed bonding layer BL2. Before the bonding process, the bonding layer BL1 and the bonding layer BL2 are kept from being exposed to the air, and thereafter, the bonding layer BL1 and the bonding layer BL2 are bonded together under vacuum, such that the sub-resonator structure S1 and the sub-resonator structure S2 are bonded together.

Figure 4E:
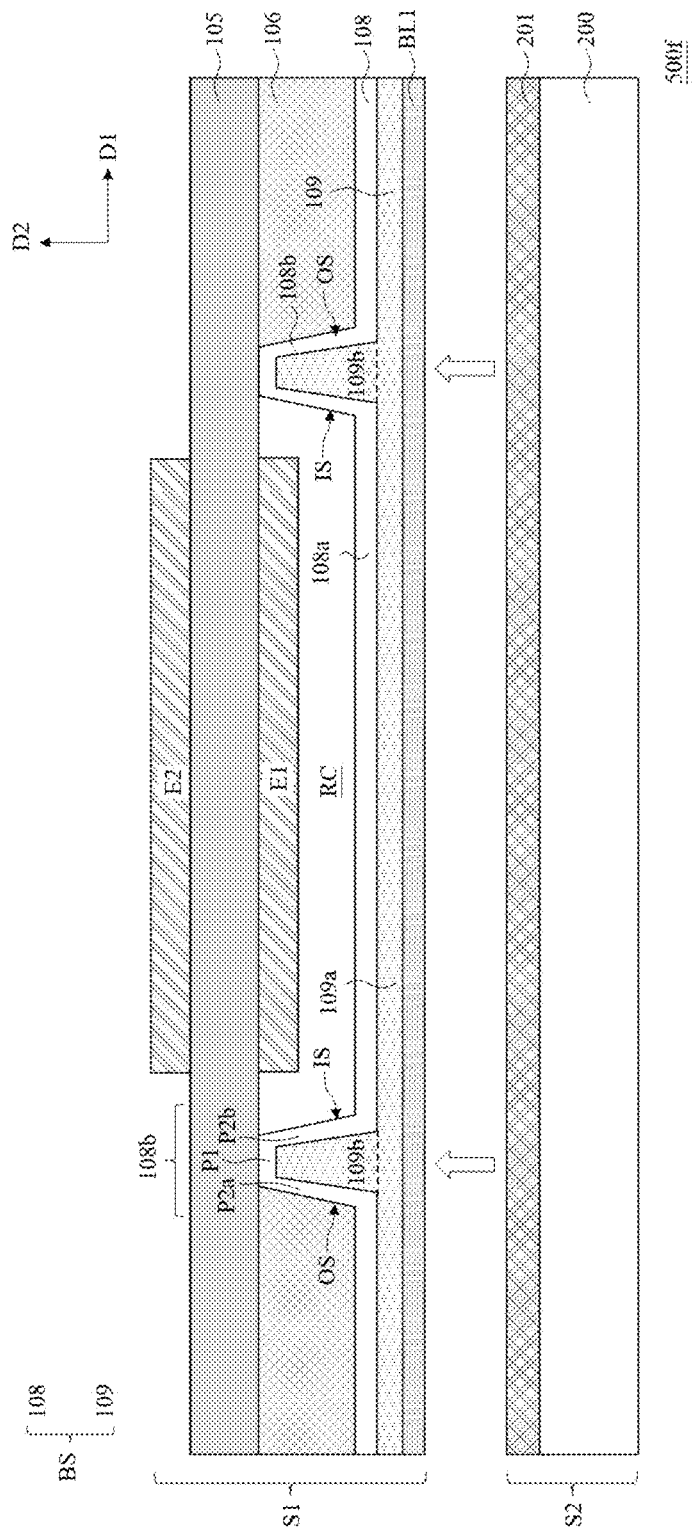

Referring to FIG. 4E, in the bulk acoustic wave resonator 500f, the sub-resonator structure S1 includes the piezoelectric layer 105, the electrodes E1 and E2 formed on opposite sides of the piezoelectric layer 105, the periphery dielectric layer 106, the cavity boundary structure BS, and the bonding layer BL1 formed on the side of the cavity boundary structure BS away from the piezoelectric layer 105; the sub-resonator structure S2 includes the carrier substrate 200 and the barrier layer 201 formed on the carrier substrate 200. The sub-resonator structure S1 and the sub-resonator structure S2 are bonded together through bonding the bonding layer BL1 and the barrier layer 201 to each other. In some embodiments, the bonding layer BL1 is deposited on the dielectric support layer 109 of the cavity boundary structure BS by a physical vapor deposition process under vacuum, and the barrier layer 201 is deposited on the carrier substrate 200 (e.g., on the surface of the carrier substrate 200 at the side close to the sub-resonator structure S1) by a physical vapor deposition process under vacuum. Before the bonding process, the bonding layer BL1 and the barrier layer 201 are kept from being exposed to the air, thereafter, the bonding layer BL1 and the barrier layer 201 are bonded and attached together under vacuum, such that the sub-resonator structure S1 and sub-resonator structure S2 are bonded together.

Figure 4F:
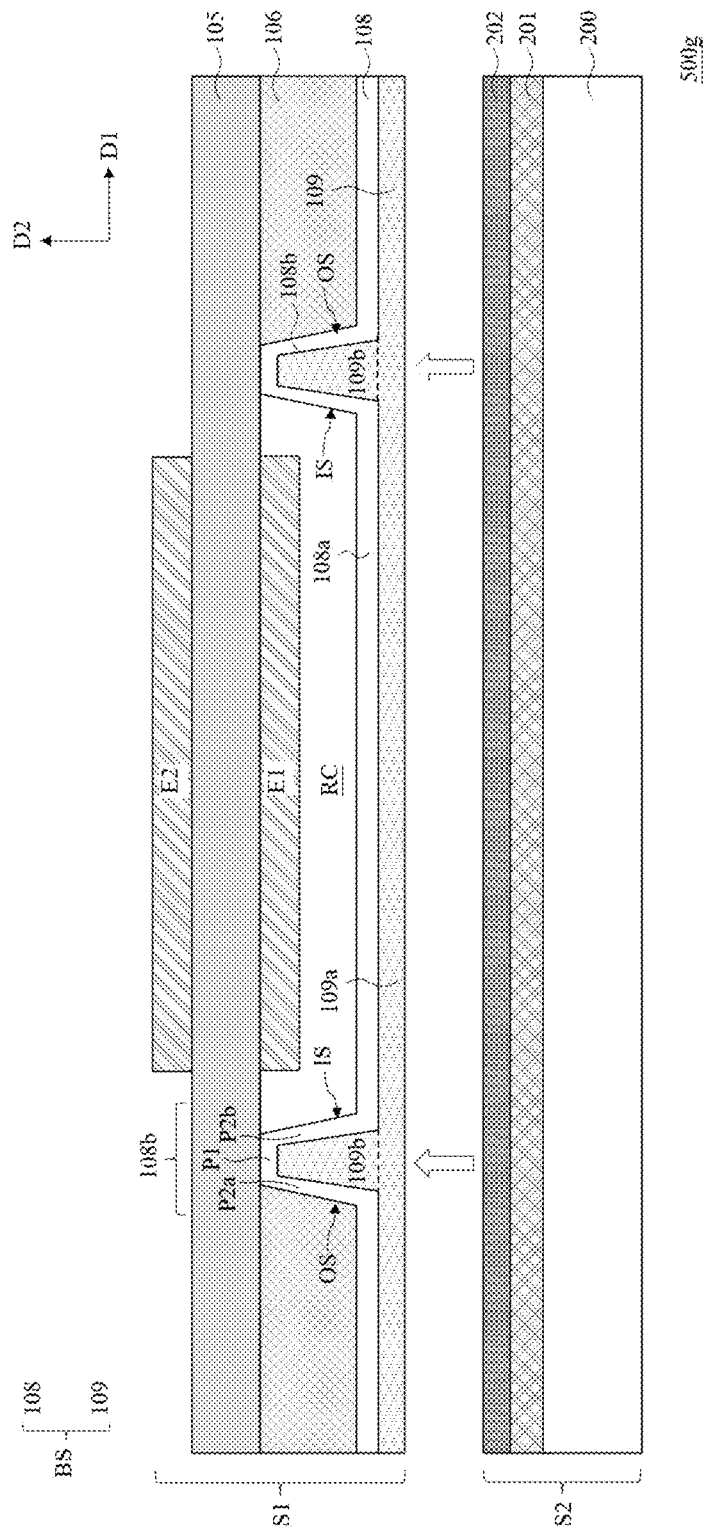

Referring to FIG. 4F, in the semiconductor structure 500g, the sub-resonator structure S1 includes the piezoelectric layer 105, the electrodes E1 and E2 formed on opposite sides of the piezoelectric layer 106, the periphery dielectric layer 106, and the cavity boundary structure BS; the sub-resonator structure S2 includes the carrier substrate 200, and the barrier layer 201 and the buffer layer 202 sequentially formed on the carrier substrate 200. In this embodiment, the sub-resonator structure S1 and the sub-resonator structure S2 are bonded together through bonding the dielectric support layer 109 of the cavity boundary structure BS and the buffer layer 202 to each other. In some embodiments, the buffer layer 202 is deposited on the barrier layer 201 (e.g., on the surface of the barrier layer 201 at the side away from the carrier substrate 200 and close to the sub-resonator structure S1) by a physical vapor deposition process under vacuum. The dielectric support layer 109 of the cavity boundary structure BS and the buffer layer 202 may be bonded using any suitable bonding process, in some embodiments, before the bonding process, the cavity boundary structure BS and buffer layer 202 are kept from being exposed to air, thereafter, the dielectric support layer 109 of the cavity boundary structure BS and buffer layer 202 are bonded and attached together under vacuum, such that the sub-resonator structure S1 and the sub-resonator structure S2 are bonded together.

Figure 4G:
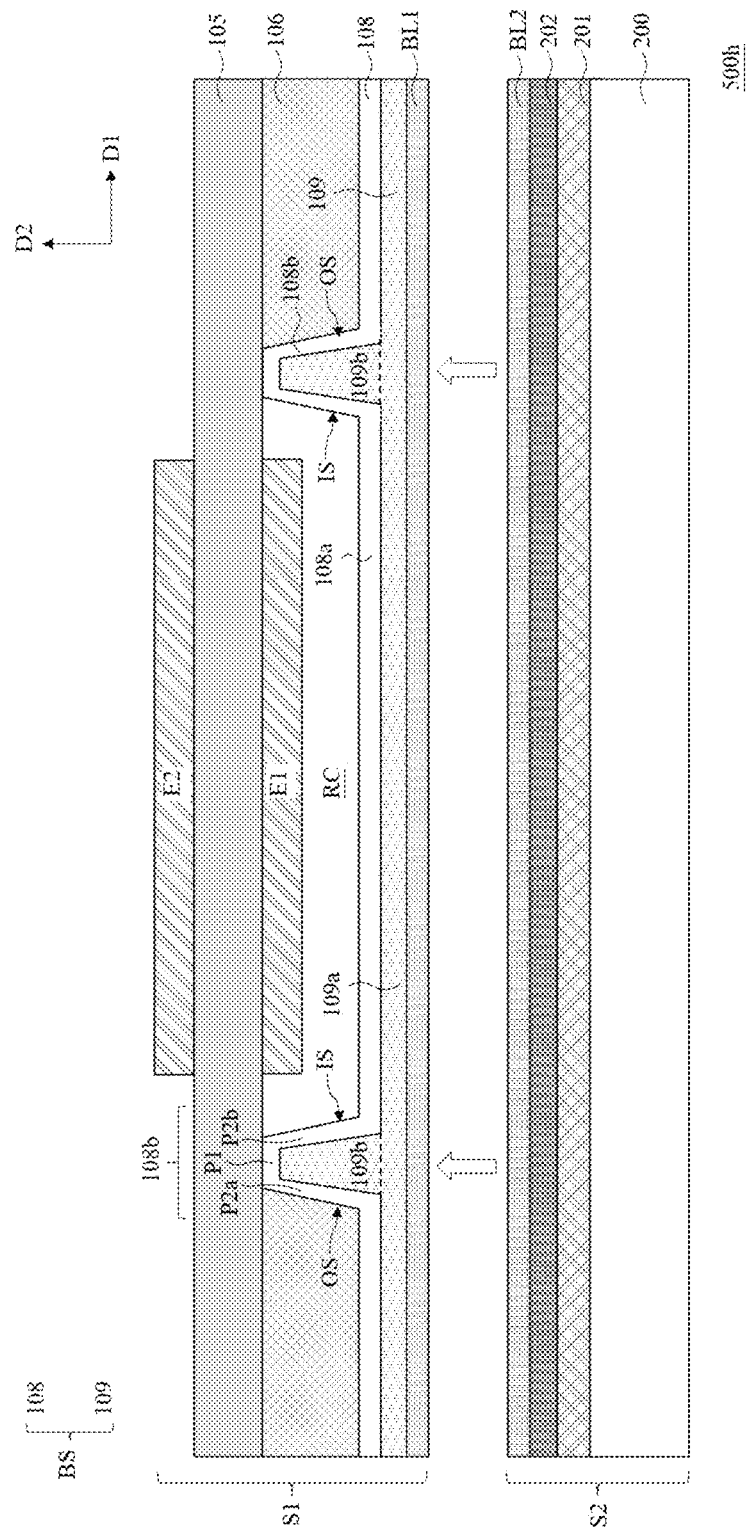

Referring to FIG. 4G, in the semiconductor structure 500h, the sub-resonator structure S1 includes the piezoelectric layer 105, the electrodes E1 and E2 formed on opposite sides of the piezoelectric layer 105, the periphery dielectric layer 106, the cavity boundary structure BS and the bonding layer BL1; the sub-resonator structure S2 includes the carrier substrate 200, and the barrier layer 201, the buffer layer 202 and the bonding layer BL2 sequentially formed on the carrier substrate 200. The sub-resonator structure S1 and the sub-resonator structure S2 are bonded together through bonding the bonding layer BL1 and the bonding layer BL2 to each other. In some embodiments, the bonding layer BL1 is deposited on the dielectric support layer 109 of the cavity boundary structure BS by a physical vapor deposition process under vacuum, and the bonding layer BL2 is deposited on the buffer layer 202 (e.g., on the surface of the buffer layer 202 at the side away from the barrier layer 201 and close to the sub-resonator structure S1) by a physical vapor deposition process under vacuum. Before the bonding process, the bonding layer BL1 and the bonding layer BL2 are kept from being exposed to the air, thereafter, the bonding layer BL1 and the bonding layer BL2 are bonded and attached together under vacuum, such that the sub-resonator structure S1 and the sub-resonator structure S2 are bonded together.

Figure 4H:
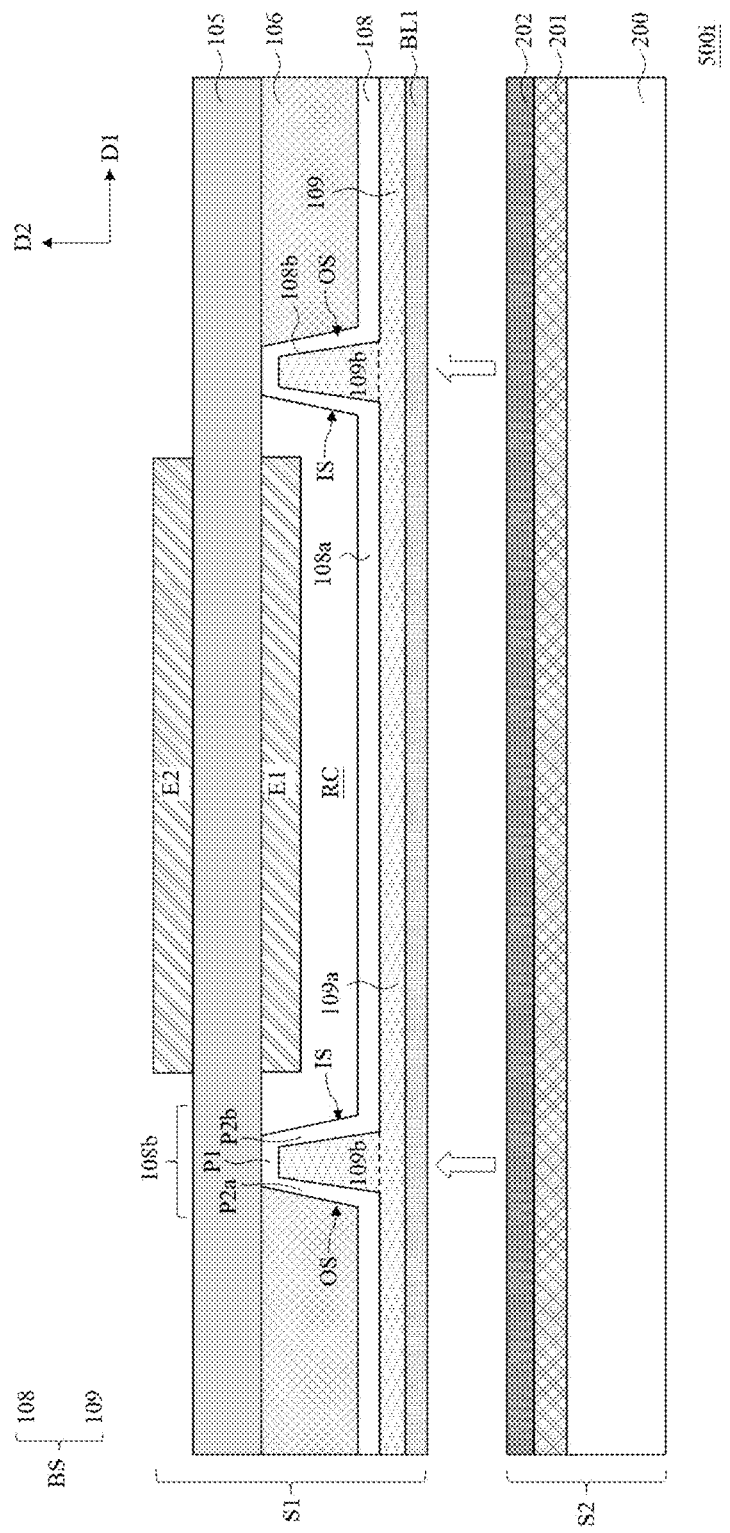

Referring to FIG. 4H, in the semiconductor structure 500i, the sub-resonator structure S1 includes the piezoelectric layer 105, the electrodes E1 and E2 formed on opposite sides of the piezoelectric layer 105, the periphery dielectric layer 106, the cavity boundary structure BS and the bonding layer BL1; the sub-resonator structure S2 includes the carrier substrate 200, and the barrier layer 201 and the buffer layer 202 sequentially formed on the carrier substrate 200. In this embodiment, the sub-resonator structure S1 and the sub-resonator structure S2 are bonded together through bonding the bonding layer BL1 and the buffer layer 202 to each other. In some embodiments, the bonding layer BL1 is deposited on the dielectric support layer 109 of the cavity boundary structure BS by a physical vapor deposition process under vacuum, and the buffer layer 202 is deposited on the barrier layer 201 (e.g., on the surface of the barrier layer 201 at the side away from the carrier substrate 200 and close to the sub-resonator structure S1) by a physical vapor deposition process under vacuum. Before the bonding process, the bonding layer BL1 and the buffer layer 202 are kept from being exposed to the air, thereafter, the bonding layer BL1 and the buffer layer 202 are bonded and attached together under vacuum, such that the sub-resonator structure S1 and sub-resonator structure S2 are bonded together.

Figure 5:
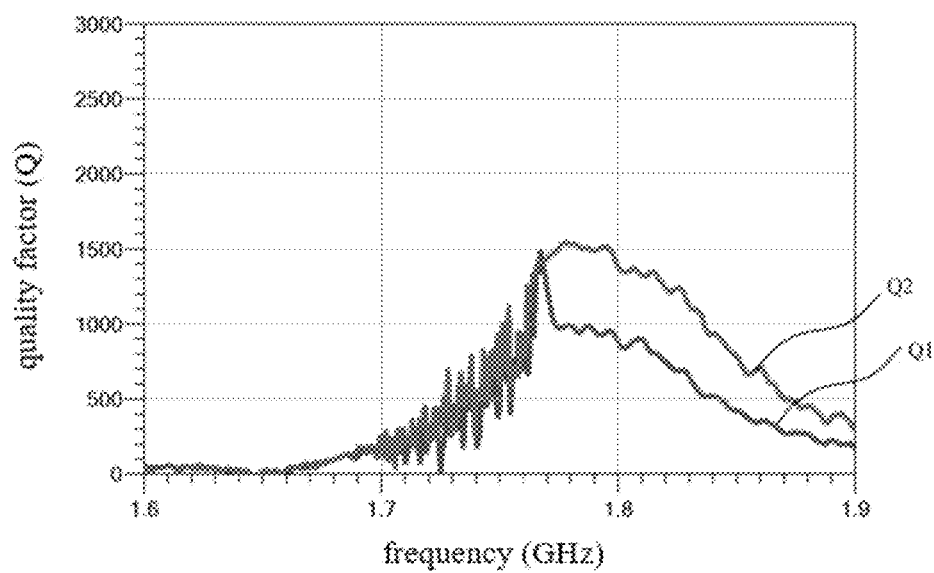
FIG. 5 is a graph comparing the quality factor changing with frequency of a bulk acoustic wave resonator according to an embodiment of the present disclosure and the quality factor changing with frequency of a conventional bulk acoustic wave resonator.

FIG. 5 is a graph comparing the curve Q1 of the quality factor changing with frequency of a conventional hulk acoustic wave resonator without a charge accumulation preventing layer (for example, with a carrier substrate 200 has a contact interface between monocrystalline silicon and silicon oxide on the surface thereot) and the curve Q2 of the quality factor changing with frequency of a bulk acoustic wave resonator provided with a charge accumulation preventing layer and a cavity boundary structure according to an embodiment of the present disclosure. As shown in FIG. 5, by comparing the curve Q1 and the curve Q2, it can be seen that, in the embodiments of the present disclosure, through disposing the charge accumulation preventing layer, undesired conductive channel is avoided form being generated due to charge accumulation on the surface of the carrier substrate 200, which can avoid or reduce the radio frequency loss of the resonator, thereby improving the performance of the resonator, and the quality factor (Q) of the resonator is greatly improved.

The embodiments of the present disclosure further provide a filter, including the bulk acoustic wave resonator described in any one of the foregoing embodiments.

In various embodiments of the present disclosure, the cavity is defined by the cavity boundary structure, which can improve the mechanical support strength of the cavity boundary structure and the resonant carrier constituted thereby. In some embodiments, the cavity boundary structure is disposed to include a boundary layer with a dual-wall structure and a dielectric layer covering the boundary layer and filling between the dual-wall structure. Such a configuration can further improve the mechanical support strength of the cavity boundary structure and the resonant carrier constituted thereby, thereby improving the performance of the resonator. In addition, through disposing the cavity boundary structure as a bilayer structure, the choices for the materials of the cavity boundary structure has more possibilities. Further, through disposing the charge accumulation preventing layer on the surface of the carrier substrate and removing the electron-rich material (e.g., native silicon oxide layer) that may exist on the surface of the carrier substrate before disposing the charge accumulation preventing layer, undesired conductive channel is avoided from being generated due to charge accumulation on the surface of the carrier substrate. For example, the carder substrate may be a semiconductor substrate, the charge accumulation preventing layer includes a non-electron-rich material, and at least a surface layer of the charge accumulation preventing layer contacting the carrier substrate does not include an electron-rich material; as such, a contact interface between a semiconductor material and an electron-rich material (e.g., monocrystalline silicon and silicon oxide) that may cause charge accumulation can be avoided from being formed on the surface of the carrier substrate, thereby avoiding the semiconductor material of the carrier substrate from trapping electrons from electron-rich material to generate undesired conductive channel due to charge accumulation, such a configuration can avoid or reduce the radio frequency loss of the bulk acoustic wave resonator and the filter including the same, thereby improving the performance and quality factor of the resonator and the filter.

The following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, features in one embodiment or in different embodiments of the present disclosure can be combined.

The above are only the specific embodiments of the present disclosure, but the scope of protection of the present disclosure is not limited thereto. Any of those skilled in the art can easily think of changes or substitutions within the technical scope disclosed in the present disclosure, which should be covered by the scope of protection of the present disclosure. Therefore, the scope of protection of the present disclosure shall be subject to the scope of protection of the claims.

The invention claimed is:

1. A bulk acoustic wave resonator, comprising:
a carrier substrate, having a main surface extending along a first direction;
a piezoelectric layer, located on a side of the carrier substrate in a second direction perpendicular to the main surface of the carrier substrate;
a first electrode and a second electrode, disposed on opposite sides of the piezoelectric layer in the second direction;
a cavity boundary structure, disposed between the carrier substrate and the piezoelectric layer in the second direction, wherein the cavity boundary structure has a body part and a protruding part, the body part extends along the first direction, and the protruding part protrudes from the body part along the second direction away from the carrier substrate and toward the piezoelectric layer;
a resonant cavity, defined by the cavity boundary structure and the piezoelectric layer; and
a periphery dielectric layer, located on a side of the protruding part of the cavity boundary structure away from the resonant cavity, and between the body part of the cavity boundary structure and the piezoelectric layer, a material of the periphery dielectric layer is different from a material of at least a portion of the protruding part adjacent to the periphery dielectric layer.

2. The bulk acoustic wave resonator of claim 1, wherein the protruding part of the cavity boundary structure has an inner sidewall and an outer sidewall opposite to each other, the body part comprises a first portion and a second portion, the first portion is located between the inner sidewall of the protruding part in the first direction, and the second portion is located on a side of the protruding part adjacent to the outer sidewall of the protruding part in the first direction.

3. The bulk acoustic wave resonator of claim 2, wherein the resonant cavity is surrounded by the protruding part of the cavity boundary structure and is defined by the inner sidewall of the protruding part in the first direction, and the resonant cavity is defined between the first portion of the cavity boundary structure and a portion of the piezoelectric layer in the second direction.

4. The bulk acoustic wave resonator of claim 2, wherein the periphery dielectric layer is located between the second portion of the body part of the cavity boundary structure and the piezoelectric layer in the second direction.

5. The bulk acoustic wave resonator of claim 2, wherein the periphery dielectric layer surrounds the protruding part of the cavity boundary structure in the first direction, and the protruding part separates the periphery dielectric layer apart from the resonant cavity.

6. The bulk acoustic wave resonator of claim 1, wherein the cavity boundary structure comprises a boundary layer and a dielectric support layer, the boundary layer is disposed on a side of the piezoelectric layer and the periphery dielectric layer close to the carrier substrate, and the dielectric support layer is disposed on a side of the boundary layer close to the carrier substrate, and between the boundary layer and the carrier substrate, a material of the periphery dielectric layer is different from a material of the boundary layer.

7. The bulk acoustic wave resonator of claim 6, wherein the resonant cavity is defined by the piezoelectric layer and the boundary layer of the cavity boundary structure.

8. The bulk acoustic wave resonator of claim 6, wherein the dielectric support layer comprises a dielectric body part and a dielectric protruding part, the dielectric body part extends along the first direction, and the dielectric protruding part protrudes from the dielectric body part in the second direction away from the carder substrate and toward the piezoelectric layer, wherein the boundary layer comprises a boundary body part and a boundary protruding part, the boundary body part extends along the first direction, and the boundary body part and the dielectric body part constitute the body part of the cavity boundary structure, the boundary protruding part is located on sidewalls of the dielectric protruding part and a surface of the dielectric protruding part away from the carrier substrate, the boundary protruding part and the dielectric protruding part constitute the protruding part of the cavity boundary structure.

9. The bulk acoustic wave resonator of claim 8, wherein the boundary protruding part has a dual-wall structure, and comprises an inner wall part, an outer wall part, and a connecting part, the inner wall part and the outer wall part are connected to each other through the connecting part; the dielectric protruding part is filled between the inner wall part and the outer wall part of the boundary protruding part in the first direction, and the connecting part is located between the dielectric protruding part and the piezoelectric layer in the second direction.

10. The bulk acoustic wave resonator according to claim 1, wherein the carrier substrate and the cavity boundary structure are bonded to and in direct contact with each other.

11. The bulk acoustic wave resonator according to claim 1, further comprising: a charge accumulation preventing layer, disposed between the cavity boundary structure and the carrier substrate, the charge accumulation preventing layer is configured to avoid undesired conductive channel from being generated due to charge accumulation on a surface of the carrier substrate.

12. The bulk acoustic wave resonator according to claim 11, wherein the carrier substrate is a semiconductor substrate, the charge accumulation preventing layer is in direct contact with the carrier substrate, and at least a surface layer of the charge accumulation preventing layer directly contacting the carrier substrate is a non-conductive and non-silicon-oxide layer.

13. The bulk acoustic wave resonator according to claim 12, wherein at least the surface layer of the charge accumulation preventing layer directly contacting the carrier substrate comprises at least one selected from the group consisting of polysilicon, amorphous silicon, silicon nitride, silicon carbide, aluminum oxide and gallium nitride, wherein a contact interface between the carrier substrate and the charge accumulation preventing layer does not include silicon oxide.

14. The bulk acoustic wave resonator according to claim 11, wherein the charge accumulation preventing layer comprises a barrier layer, the barrier layer is disposed on a side of the carrier substrate close to the cavity boundary structure, and is in direct contact with the carrier substrate.

15. The bulk acoustic wave resonator of claim 14, further comprising: a buffer layer, disposed on a side of the barrier layer away from the carrier substrate, and between the barrier layer and the cavity boundary structure.

16. The bulk acoustic wave resonator of claim 15, wherein one of a material of the buffer layer and a material of the barrier layer has tensile stress, and the other one of the material of the buffer layer and the material of the barrier layer has compressive stress, so as to be configured to balance a warpage of the carrier substrate.

17. The bulk acoustic wave resonator of claim 15, wherein the cavity boundary structure comprises a boundary layer and a dielectric support layer located on a side of the boundary layer adjacent to the carrier substrate, wherein the buffer layer and the dielectric support layer of the cavity boundary structure are bonded to each other.

18. The bulk acoustic wave resonator of claim 15, further comprising:
a first bonding layer, disposed on a side of the cavity boundary structure close to the carrier substrate,
a second bonding layer, disposed on a side of the buffer layer close to the cavity boundary structure,
the first bonding layer and the second bonding layer are bonded to each other.

19. The bulk acoustic wave resonator of claim 15, further comprising:
a bonding layer, disposed on a side of the cavity boundary structure close to the carrier substrate, and the bonding layer and the buffer layer are bonded to each other.

20. The bulk acoustic wave resonator according to claim 14, further comprising a bonding layer, the bonding layer is disposed on a side of the cavity boundary structure close to the carrier substrate, and the bonding layer and the barrier layer are bonded to each other.

21. The bulk acoustic wave resonator of claim 14, further comprising:
a first bonding layer, disposed on a side of the cavity boundary structure close to the carrier substrate,
a second bonding layer, disposed on a side of the barrier layer close to the cavity boundary structure, and
the first bonding layer and the second bonding layer are bonded to each other.

22. The bulk acoustic wave resonator of claim 14, wherein the barrier layer and the cavity boundary structure are bonded to each other.

23. The hulk acoustic wave resonator of claim 11, further comprising:
a bonding layer, disposed between the carrier substrate and the cavity boundary structure and serving as the charge accumulation preventing layer,
wherein the bonding layer is disposed on a side of the cavity boundary structure close to the carrier substrate, and the bonding layer and the carrier substrate are bonded to each other.

24. The bulk acoustic wave resonator of claim 1, wherein the periphery dielectric layer comprises a first material, and at least the portion of the cavity boundary structure adjacent to the periphery dielectric layer comprises a second material, and the first material and the second material are configured such that an etchant used in an etching process for forming the resonant cavity has an etching selectivity ratio of the first material to the second material.

* * * * *

UNITED STATES PATENT AND TRADEMARK OFFICE
CERTIFICATE OF CORRECTION

PATENT NO. : 11,777,472 B2
APPLICATION NO. : 17/992170
DATED : October 3, 2023
INVENTOR(S) : Guojun Weng and Jian Wang It is certified that error appears in the above-identified patent and that said Letters Patent is hereby corrected as shown below:

In the Claims

In Claim 8, Column 30, Line 24, please change "carder" to --carrier--.

In Claim 23, Column 32, Line 18, please change "hulk" to --bulk--.

Signed and Sealed this
Twenty-third Day of January, 2024

Katherine Kelly Vidal
*Director of the United States Patent and Trademark Office*